(12) United States Patent
Onodera et al.

(10) Patent No.: US 10,818,431 B2
(45) Date of Patent: Oct. 27, 2020

(54) ELECTRONIC COMPONENT

(71) Applicant: TDK CORPORATION, Tokyo (JP)

(72) Inventors: Shinya Onodera, Tokyo (JP); Takehisa Tamura, Tokyo (JP); Atsushi Takeda, Tokyo (JP); Ken Morita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 14 days.

(21) Appl. No.: 16/142,212

(22) Filed: Sep. 26, 2018

(65) Prior Publication Data

US 2019/0096576 A1 Mar. 28, 2019

(30) Foreign Application Priority Data

Sep. 28, 2017 (JP) ................. 2017-188209

(51) Int. Cl.
*H01G 2/06* (2006.01)
*H01G 4/005* (2006.01)
*H05K 1/18* (2006.01)
*H01G 4/232* (2006.01)
*H01G 4/30* (2006.01)
*H01G 4/12* (2006.01)

(52) U.S. Cl.
CPC ............ *H01G 2/065* (2013.01); *H01G 4/005* (2013.01); *H01G 4/12* (2013.01); *H01G 4/232* (2013.01); *H01G 4/30* (2013.01); *H05K 1/181* (2013.01); *H01G 4/2325* (2013.01)

(58) Field of Classification Search
CPC ...... H01G 4/248; H01G 4/012; H01G 4/1209; H01G 4/232; H01G 4/30; H01G 4/0085; H01G 4/1227; H01G 4/2325; H01G 4/065; H01G 4/005; H01G 4/12; H01G 4/181
See application file for complete search history.

(56) References Cited

U.S. PATENT DOCUMENTS

2016/0005539 A1* 1/2016 Lee .................. H01G 2/065
174/260
2017/0154729 A1* 6/2017 Lee .................. H01G 4/012

FOREIGN PATENT DOCUMENTS

JP     H08-107038 A   4/1996
JP     4947076 B2     6/2012

* cited by examiner

*Primary Examiner* — Michael P McFadden
(74) *Attorney, Agent, or Firm* — Oliff PLC

(57) ABSTRACT

An element body of a rectangular parallelepiped shape includes a first principle surface arranged to constitute a mounting surface, a second principle surface opposing the first principle surface in a first direction, a pair of side surfaces opposing each other in a second direction, and a pair of end surfaces opposing each other in a third direction. An external electrode is disposed at an end portion of the element body in the third direction. The external electrode includes a conductive resin layer formed on the end surface. A thickness of the conductive resin layer gradually increases from the second principle surface toward the first principle surface in the first direction. The conductive resin layer includes a thickest portion at a position near the first principle surface in the first direction.

9 Claims, 18 Drawing Sheets

ELECTRONIC COMPONENT

BACKGROUND OF THE INVENTION

1. Field of the Invention

The present invention relates to an electric component.

2. Description of Related Art

Known electronic components include an element body of a rectangular parallelepiped shape, a plurality of external electrodes, and a plurality of internal electrodes (see, for example, Japanese Unexamined Patent Publication No. H8-107038). The element body includes a pair of principle surfaces opposing each other, a pair of end surfaces opposing each other, and a pair of side surfaces opposing each other. The plurality of external electrodes is disposed at each end portion of the element body in a direction in which the pair of end surfaces opposes each other. The external electrode includes a conductive resin layer covering the entire end surface.

SUMMARY OF THE INVENTION

An object of one aspect of the present invention is to provide an electronic component that suppresses occurrence of a crack in an element body and a solder fillet.

An electronic component according to one aspect includes an element body of a rectangular parallelepiped shape, a plurality of external electrodes, and an internal conductor. The element body includes a first principle surface arranged to constitute a mounting surface, a second principle surface opposing the first principle surface in a first direction, a pair of side surfaces opposing each other in a second direction, and a pair of end surfaces opposing each other in a third direction. The plurality of external electrodes is disposed at both end portions of the element body in the third direction. The internal conductor is exposed to a corresponding end surface of the pair of end surface. The external electrodes include a conductive resin layer formed on the corresponding end surface. A thickness of the conductive resin layer gradually increases from the second principle surface toward the first principle surface in the first direction. The conductive resin layer includes a thickest portion having a maximum thickness at a position near the first principle surface in the first direction.

In a case where an electronic component is solder-mounted on an electronic device, an external force applied onto the electronic component from the electronic device sometimes may act as a stress on the element body. The electronic device includes, for example, a circuit board or an electronic component. The external force acts on the element body from a solder fillet formed at the solder-mounting, through the external electrode. In this case, a crack may occur in the element body.

In the one aspect, the conductive resin layer is formed on the end surface. Therefore, even in a case where an external force acts on the electronic component from the electronic device, the conductive resin layer absorbs the external force. Consequently, the one aspect suppresses occurrence of a crack in the element body.

In a case where compressive stress or tensile stress due to thermal shock acts on the solder fillet, a crack may occur in the solder fillet. The compressive stress or tensile stress due to thermal shock tends to be concentrated in the region near the first principle surface of the solder fillet. Hereinafter, the compressive stress or tensile stress due to thermal shock is simply referred to as "thermal shock stress".

In the one aspect, the conductive resin layer absorbs the thermal shock stress. The thickness of the conductive resin layer gradually increases from the second principle surface toward the first principle surface in the first direction, and the thickest portion is located near the first principle surface in the first direction. The thickest portion of the conductive resin layer is very effective in absorbing the thermal shock stress. Therefore, the thermal shock stress tends not to be concentrated in the region near the first principle surface of the solder fillet. Consequently, the one aspect suppresses occurrence of a crack in the solder fillet.

In the one aspect, the thickest portion may be located nearer to the first principle surface than the second principle surface in the first direction. In this configuration, the conductive resin layer effectively absorbs the thermal shock stress concentrated in the region near the first principle surface of the solder fillet. Therefore, this configuration is reliably suppresses the occurrence of the crack in the solder fillet.

In the one aspect, the thickest portion may be located nearer to the first principle surface than the second principle surface, in the first direction in the conductive resin layer. In this configuration, the conductive resin layer effectively absorbs the thermal shock stress concentrated in the region near the first principle surface of the solder fillet. Therefore, this configuration is reliably suppresses the occurrence of the crack in the solder fillet.

In the one aspect, the conductive resin layer may cover a ridge portion located between the first principle surface and the corresponding end surface. A portion of the conductive resin layer covering the ridge portion may be located nearer to the first principle surface than the thickest portion in the first direction. The portion of the conductive resin layer covering the ridge portion may have a thickness smaller than the thickness of the thickest portion.

In this configuration, a curvature radius of the portion covering the ridge portion of the conductive resin layer is large, as compared with a configuration in which the thickness of the portion covering the ridge portion of the conductive resin layer is equal to or greater than the thickness of the thickest portion. In this configuration, therefore, a curvature radius of the ridge portion near the first principle surface of the external electrode corresponding to the ridge portion of the element body is also large. Consequently, this configuration improves flexibility of the electronic component and further reliably suppresses the occurrence of the crack in the element body.

Since the thickness of the portion covering the ridge portion of the conductive resin layer is smaller than the thickness of the thickest portion, the solder tends to accumulate at a position corresponding to the ridge portion of the external electrode. Therefore, this configuration can provide a solder pool.

In a case in which an element is described as covering another element, the element may directly cover the other element or indirectly cover the other element.

In the one aspect, the conductive resin layer may cover a region near the first principle surface of the corresponding end surface. A region between the element body and the conductive resin layer may act as a path through which moisture infiltrates. In a case where moisture infiltrates from the region between the element body and the conductive resin layer, durability of the electronic component decreases. This configuration includes few paths through which moisture infiltrates, as compared with a configuration in which the conductive resin layer covers the entire end surface. Therefore, this configuration improves moisture resistance reliability.

In the one aspect, the conductive resin layer may cover a region near the corresponding end surface of the first principle surface. In a case where the external force applied onto the electronic component from the electronic device tends to act on a region near an end surface of the first principle surface of the element body. In a configuration in which the conductive resin layer covers the region near the end surface of the first principle surface, the external force applied onto the electronic component from the electronic device tends not to act on the element body. Therefore, this configuration suppresses the occurrence of the crack in the element body.

In the one aspect, the external electrodes may include a sintered metal layer formed on the corresponding end surface to be connected to the internal conductor. The sintered metal layer may include a first region covered with the conductive resin layer and a second region exposed from the conductive resin layer. In this configuration, the sintered metal layer is favorably in contact with the internal conductor. This allows reliable electrical connection between the external electrode and the internal conductor. The conductive resin layer includes a conductive material and a resin. The conductive material includes, for example, metal powder. The resin includes, for example, a thermosetting resin. Electric resistance of the conductive resin layer is larger than electric resistance of the sintered metal layer. In a case where the sintered metal layer includes the second region, the second region is electrically connected to the electronic device without passing through the conductive resin layer. Therefore, this configuration suppresses an increase in equivalent series resistance (ESR) even in a case where the external electrode includes the conductive resin layer.

In the one aspect, the external electrodes may include a plating layer covering the conductive resin layer and the second region of the sintered metal layer. In this configuration, the electronic component can be solder-mounting on the electronic device. The second region of the sintered metal layer is electrically connected to the electronic device via the plating layer. Therefore, this configuration further suppresses the increase in the ESR.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF EMBODIMENTS

Figure 1:
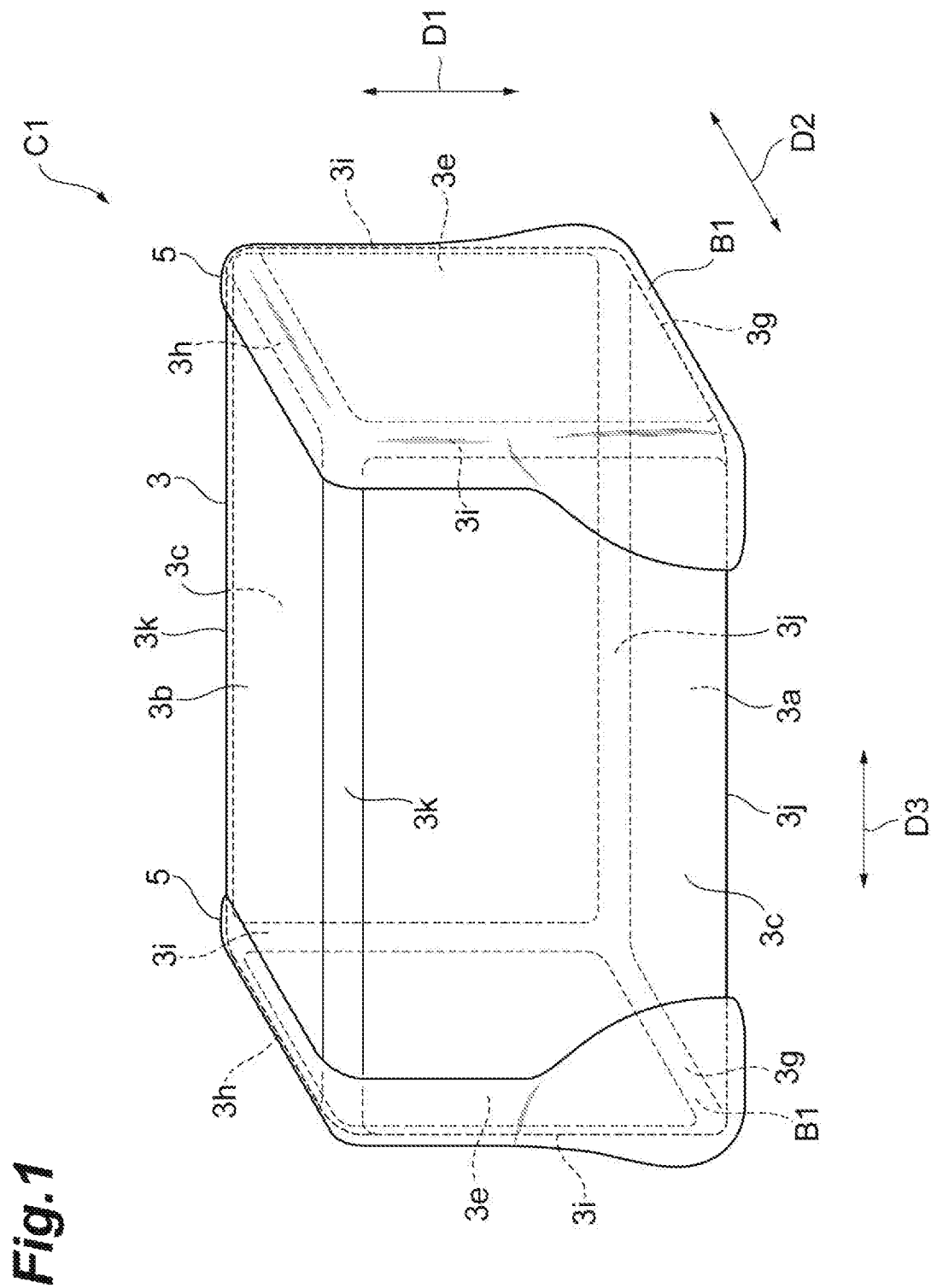
FIG. 1 is a perspective view of a multilayer capacitor according to a first embodiment.

Hereinafter, embodiments of the present invention will be described in detail with reference to the accompanying drawings. In the following description, the same elements or elements having the same functions are denoted with the same reference numerals and overlapped explanation is omitted.

First Embodiment

Figure 2:
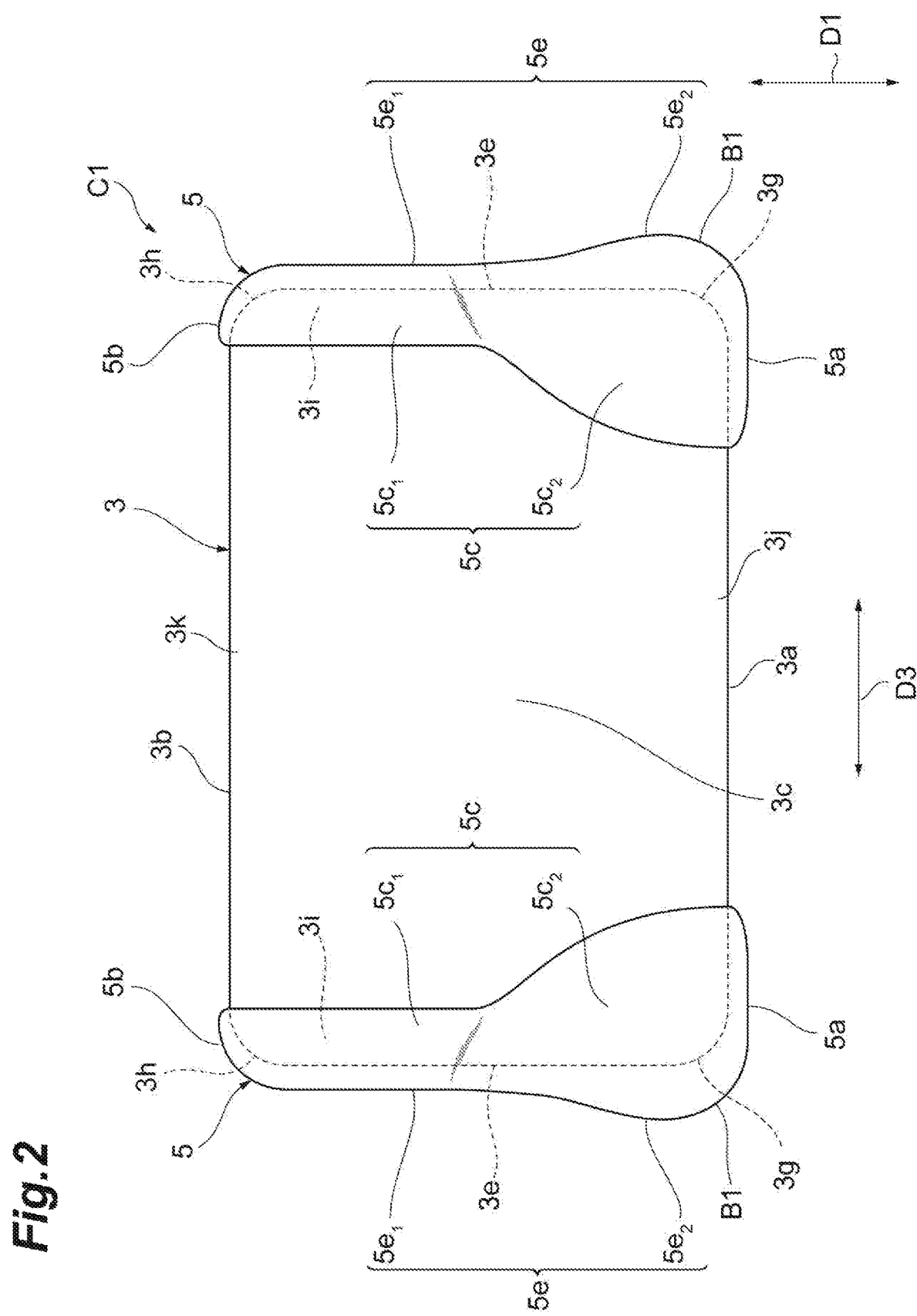
FIG. 2 is a side view of the multilayer capacitor according to the first embodiment.
Figure 3:
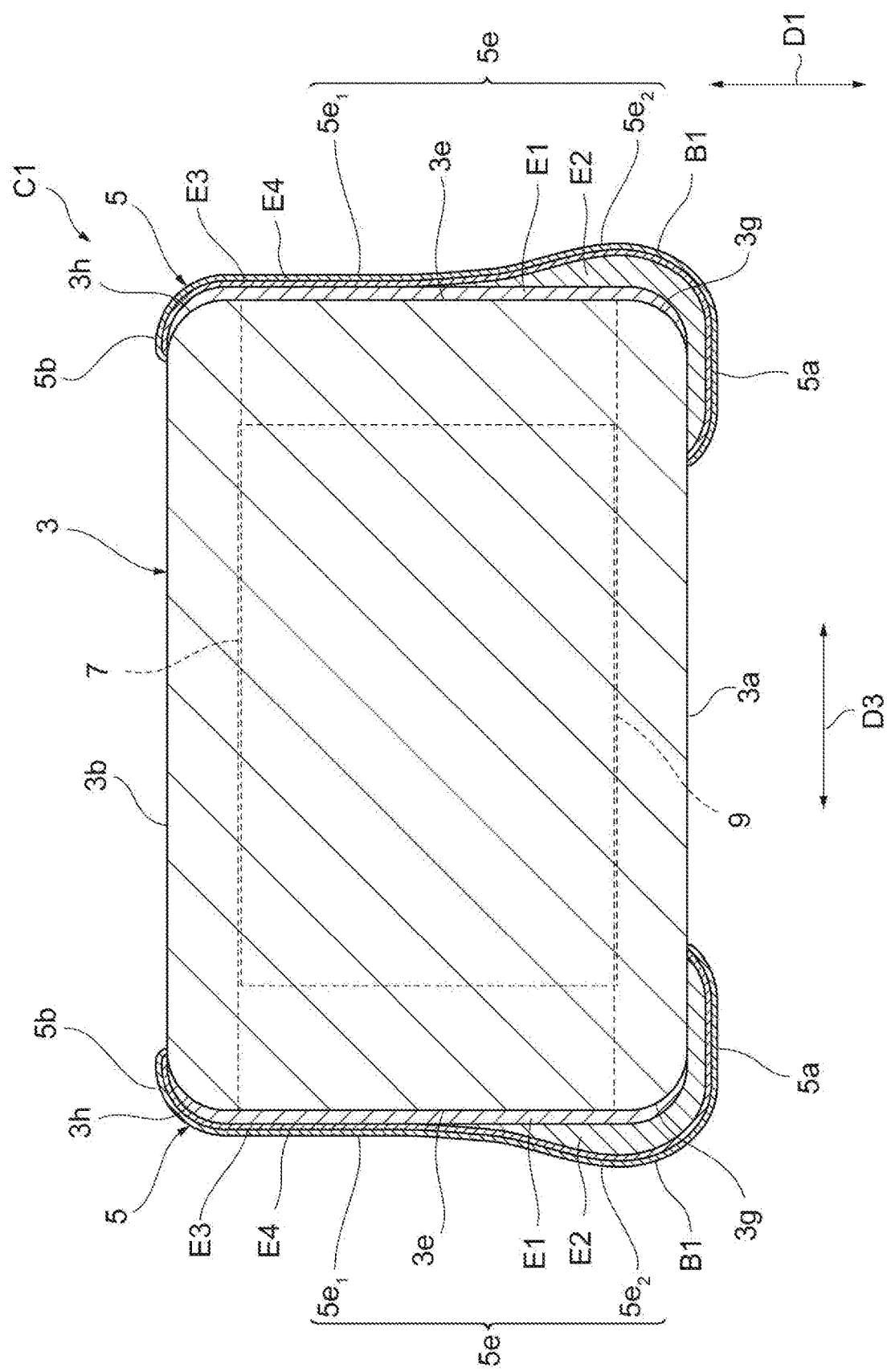
FIG. 3 is a view illustrating a cross-sectional configuration of the multilayer capacitor according to the first embodiment.
Figure 4:
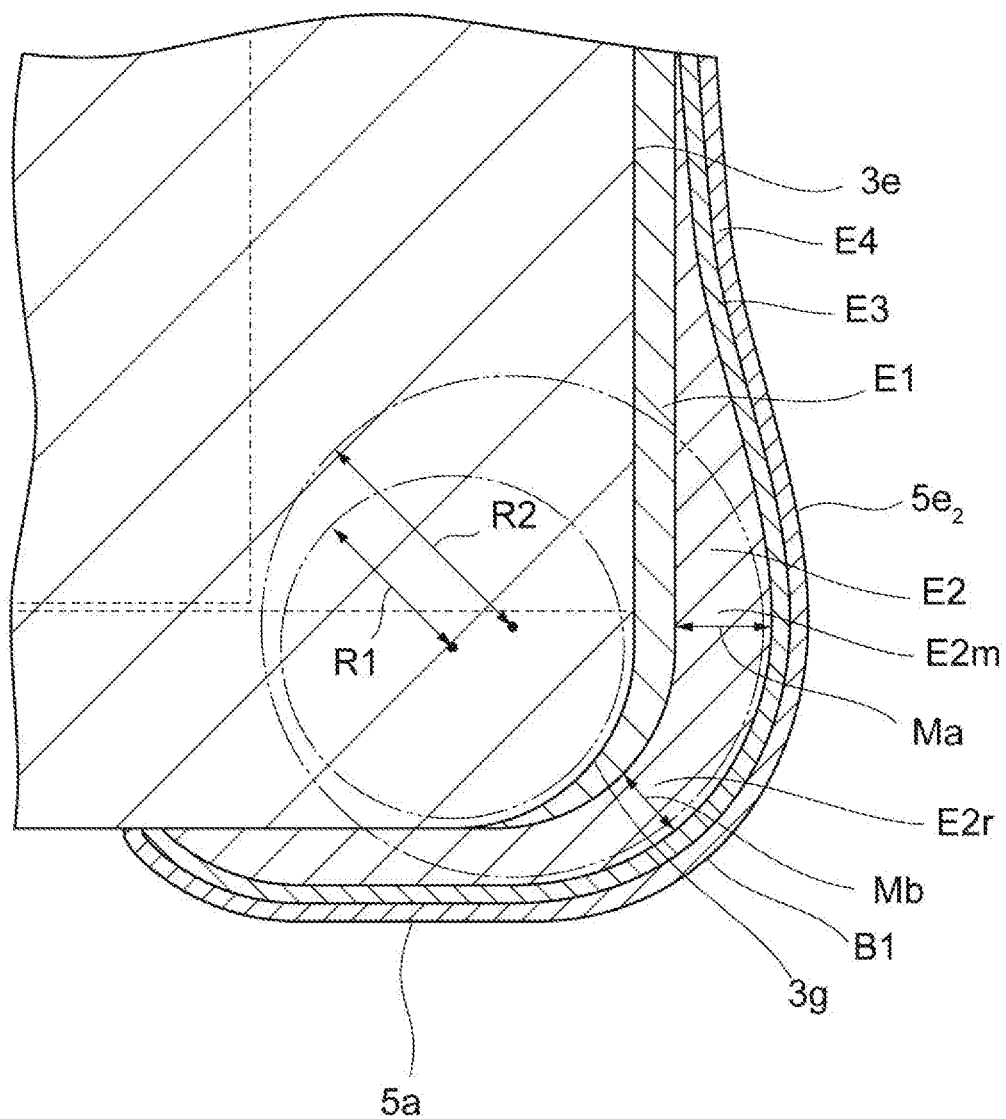
FIG. 4 is a view illustrating a cross-sectional configuration of an external electrode.
Figure 5:
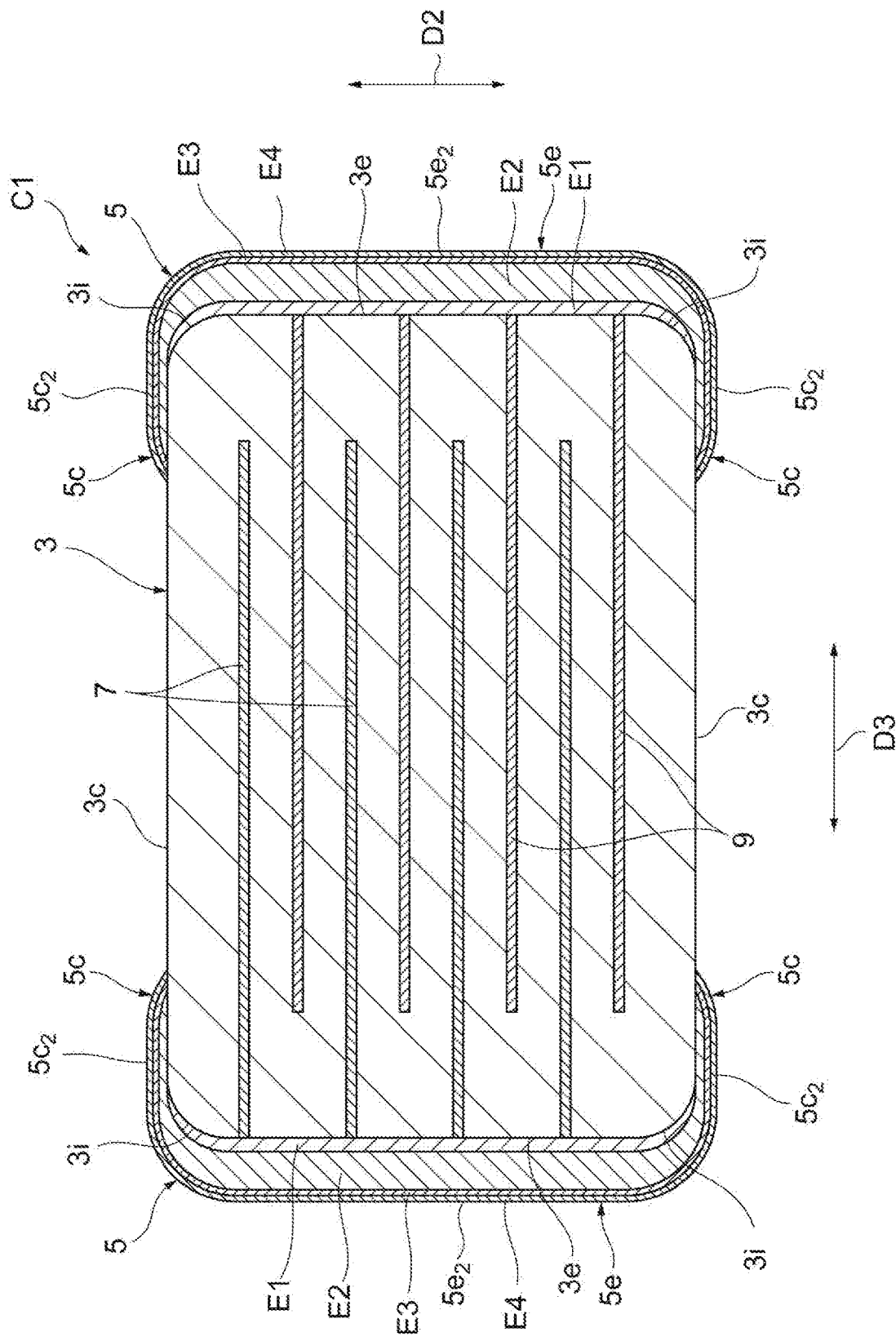
FIG. 5 is a view illustrating a cross-sectional configuration of the multilayer capacitor according to the first embodiment.
Figure 6:
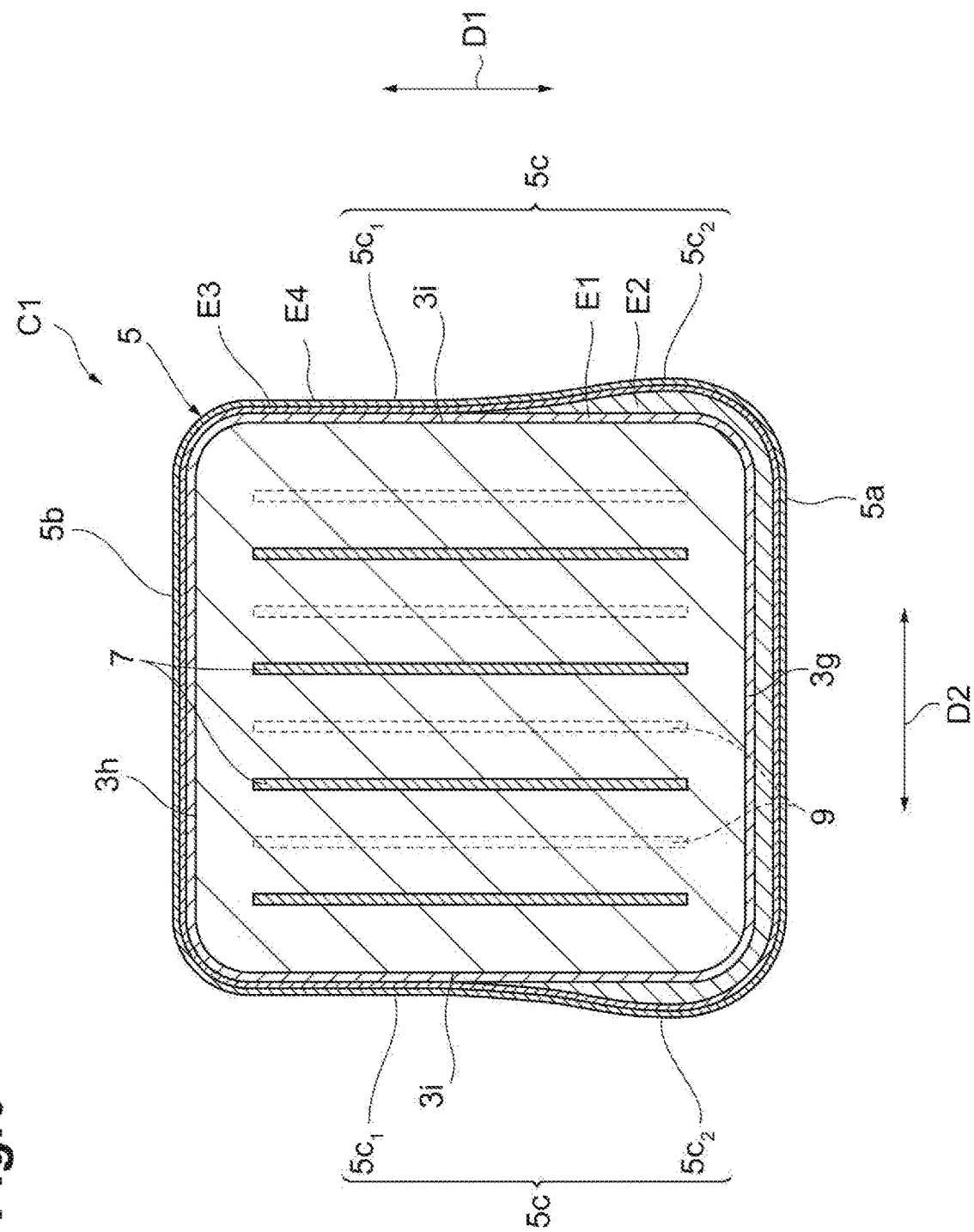
FIG. 6 is a view illustrating a cross-sectional configuration of the multilayer capacitor according to the first embodiment.
Figure 7:
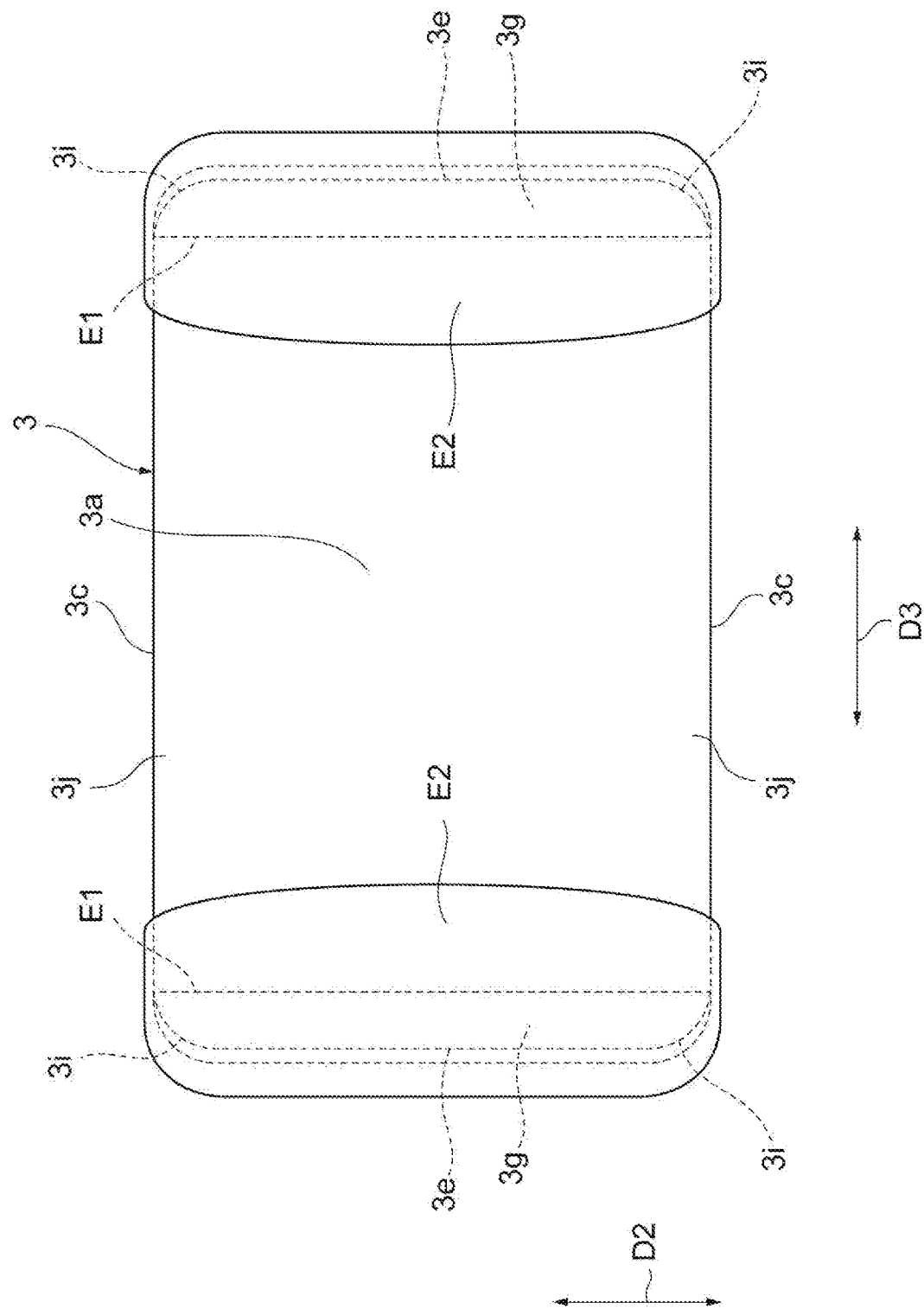
FIG. 7 is a plan view illustrating an element body, a first electrode layer, and a second electrode layer.
Figure 8:
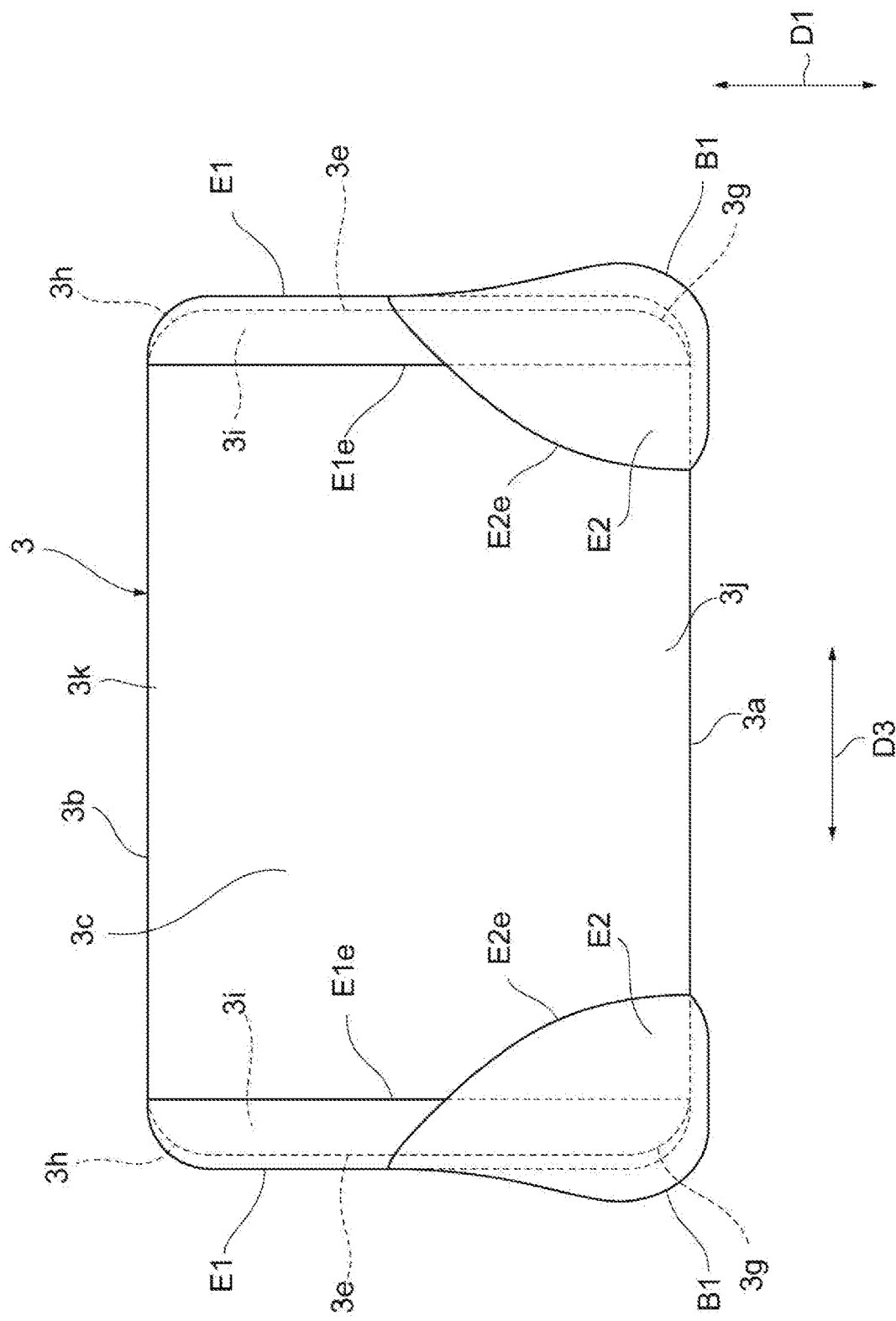
FIG. 8 is a side view illustrating the element body, the first electrode layer, and the second electrode layer.
Figure 9:
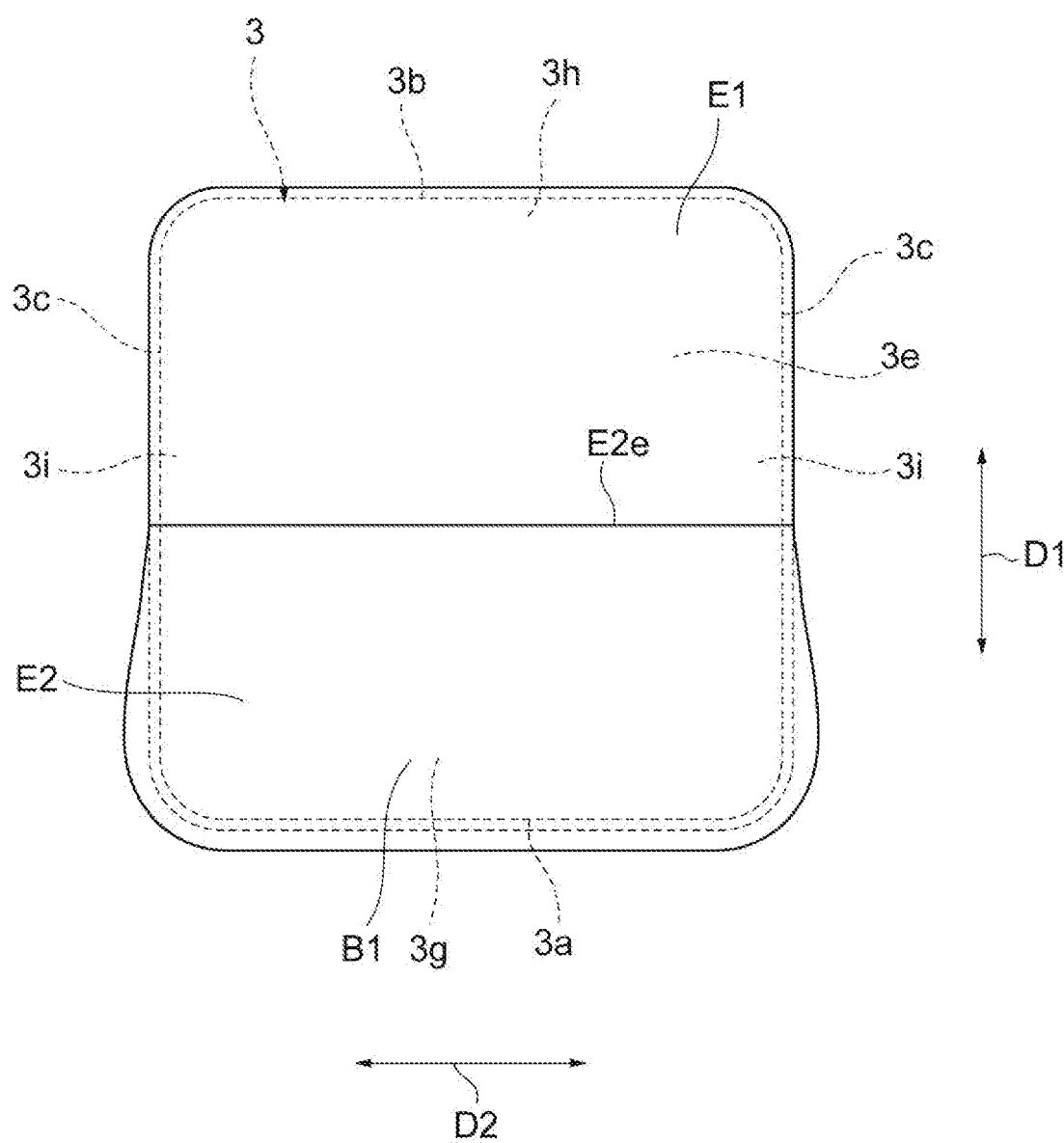
FIG. 9 is an end view illustrating the element body, the first electrode layer, and the second electrode layer.

A configuration of a multilayer capacitor C1 according to a first embodiment will be described with reference to FIGS. 1 to 9. FIG. 1 is a perspective view of the multilayer capacitor according to the first embodiment. FIG. 2 is a side view of the multilayer capacitor according to the first embodiment. FIGS. 3, 5, and 6 are views illustrating a cross-sectional configuration of the multilayer capacitor according to the first embodiment. FIG. 4 is a view illustrating a cross-sectional configuration of an external electrode. FIG. 7 is a plan view illustrating an element body, a first electrode layer, and a second electrode layer. FIG. 8 is a side view illustrating the element body, the first electrode layer, and the second electrode layer. FIG. 9 is an end view illustrating the element body, the first electrode layer, and the second electrode layer. In the first embodiment, an electronic component is, for example, the multilayer capacitor C1.

As illustrated in FIG. 1, the multilayer capacitor C1 includes an element body 3 of a rectangular parallelepiped shape and a plurality of external electrodes 5. In the present embodiment, the multilayer capacitor C1 includes a pair of external electrodes 5. The pair of external electrodes 5 is disposed on an outer surface of the element body 3. The pair of external electrodes 5 is spaced apart from each other. The rectangular parallelepiped shape includes a rectangular parallelepiped shape in which corners and ridges are chamfered, and a rectangular parallelepiped shape in which the corners and ridges are rounded.

The element body 3 includes a pair of principal surfaces 3a and 3b opposing each other, a pair of side surfaces 3c opposing each other, and a pair of end surfaces 3e opposing each other. The pair of principal surfaces 3a and 3b and the pair of side surfaces 3c have a rectangular shape. The direction in which the pair of principal surfaces 3a and 3b opposes each other is a first direction D1. The direction in which the pair of side surfaces 3c opposes each other is a second direction D2. The direction in which the pair of end surfaces 3e opposes each other is a third direction D3. The multilayer capacitor C1 is solder-mounted on an electronic device. The electronic device includes, for example, a circuit board or an electronic component. The principal surface 3a of the multilayer capacitor C1 opposes the electronic device. The principal surface 3a is arranged to constitute a mounting surface. The principal surface 3a is the mounting surface.

The first direction D1 is a direction orthogonal to the respective principal surfaces 3a and 3b and is orthogonal to the second direction D2. The third direction D3 is a direction parallel to the respective principal surfaces 3a and 3b and the respective side surfaces 3c, and is orthogonal to the first direction D1 and the second direction D2. The second direction D2 is a direction orthogonal to the respective side surfaces 3c. The third direction D3 is a direction orthogonal to the respective end surfaces 3e. In the first embodiment, a length of the element body 3 in the third direction D3 is larger than a length of the element body 3 in the first direction D1, and larger than a length of the element body 3 in the second direction D2. The third direction D3 is a longitudinal direction of the element body 3.

The pair of side surfaces 3c extends in the first direction D1 to couple the pair of principal surfaces 3a and 3b. The pair of side surfaces 3c also extends in the third direction D3. The pair of end surfaces 3e extends in the first direction D1 to couple the pair of principal surfaces 3a and 3b. The pair of end surfaces 3e also extends in the second direction D2.

The element body 3 includes a pair of ridge portions 3g, a pair of ridge portions 3h, four ridge portions 3i, a pair of ridge portions 3j, and a pair of ridge portions 3k. The ridge portion 3g is located between the end surface 3e and the principal surface 3a. The ridge portion 3h is located between the end surface 3e and the principal surface 3b. The ridge portion 3i is located between the end surface 3e and the side surface 3c. The ridge portion 3j is located between the principal surface 3a and the side surface 3c. The ridge portion 3k is located between the principal surface 3b and the side surface 3c. In the present embodiment, each of the ridge portions 3g, 3h, 3i, 3j, and 3k is rounded to curve. The element body 3 is subject to what is called a round chamfering process.

The end surface 3e and the principal surface 3a are indirectly adjacent to each other with the ridge portion 3g therebetween. The end surface 3e and the principal surface 3b are indirectly adjacent to each other with the ridge portion 3h therebetween. The end surface 3e and the side surface 3c are indirectly adjacent to each other with the ridge portion 3i therebetween. The principal surface 3a and the side surface 3c are indirectly adjacent to each other with the ridge portion 3j therebetween. The principal surface 3b and the side surface 3c are indirectly adjacent to each other with the ridge portion 3k therebetween.

The element body 3 is configured by laminating a plurality of dielectric layers in the second direction D2. The element body 3 includes the plurality of laminated dielectric layers. In the element body 3, a lamination direction of the plurality of dielectric layers coincides with the second direction D2. Each dielectric layer includes, for example, a sintered body of a ceramic green sheet containing a dielectric material. The dielectric material includes, for example, a dielectric ceramic of $BaTiO_3$ base, $Ba(Ti,Zr)O_3$ base, or $(Ba,Ca)TiO_3$ base. In an actual element body 3, each of the dielectric layers is integrated to such an extent that a boundary between the dielectric layers cannot be visually recognized. In the element body 3, the lamination direction of the plurality of dielectric layers may coincide with the first direction D1.

As illustrated in FIGS. 2, 5, and 6, the multilayer capacitor C1 includes a plurality of internal electrodes 7 and a plurality of internal electrodes 9. Each of the internal electrodes 7 and 9 is an internal conductor disposed in the element body 3. Each of the internal electrodes 7 and 9 is made of a conductive material that is commonly used as an internal conductor of a multilayer electronic component. The conductive material includes, for example, a base metal. The conductive material includes, for example, Ni or Cu. Each of the internal electrodes 7 and 9 is configured as a sintered body of conductive paste containing the conductive material described above. In the first embodiment, the internal electrodes 7 and 9 are made of Ni.

The internal electrodes 7 and the internal electrodes 9 are disposed in different positions (layers) in the second direction D2. The internal electrodes 7 and the internal electrodes 9 are alternately disposed in the element body 3 to oppose each other in the second direction D2 with an interval therebetween. Polarities of the internal electrodes 7 and the internal electrodes 9 are different from each other. In a case where the lamination direction of the plurality of dielectric layers is the first direction D1, the internal electrodes 7 and the internal electrodes 9 are disposed in different positions (layers) in the first direction D1. One end of each of the internal electrodes 7 and 9 is exposed to a corresponding end surface 3e. Each of the internal electrodes 7 and 9 includes one end exposed to the corresponding end surface 3e. A plurality of internal electrodes 7 and a plurality of internal electrodes 9 are alternately disposed in the second direction D2. The internal electrodes 7 and 9 are located in a plane substantially orthogonal to the principle surfaces 3a and 3b. The internal electrodes 7 and the internal electrodes 9 oppose each other in the second direction D2. The direction (second direction D2) in which the internal electrodes 7 and the internal electrodes 9 oppose each other is orthogonal to the direction (first direction D1) orthogonal to the principle surfaces 3a and 3b.

As illustrated in FIG. 2, the external electrodes 5 are disposed at both end portions of the element body 3 in the third direction D3. Each of the external electrodes 5 is disposed on the corresponding end surface 3e side of the element body 3. As illustrated in FIGS. 3, 5, and 6, the external electrode 5 includes a plurality of electrode portions 5a, 5b, 5c, and 5e. The electrode portion 5a is disposed on the principal surface 3a and on the ridge portion 3g. The electrode portion 5b is disposed on the ridge portion 3h. The electrode portion 5c is disposed on each side surface 3c and on each ridge portion 3i. The electrode portion 5e is disposed on the corresponding end surface 3e. The external electrode 5 also includes electrode portions disposed on the ridge portions 3j and 3k.

The external electrode 5 is formed on the four surfaces, that is, the principal surface 3a, the end surface 3e, and the pair of side surfaces 3c, as well as on the ridge portions 3g, 3h, 3i, and 3j. The electrode portions 5a, 5b, 5c, and 5e adjacent each other are coupled and are electrically connected to each other. In the present embodiment, the external electrode 5 is not intentionally formed on a principal surface 3b. Each electrode portion 5e disposed on each end surface 3e covers all one ends of the corresponding internal electrodes 7 or 9. Each of the internal electrodes 7 and 9 is directly connected to the corresponding electrode portion 5e. Each of the internal electrodes 7 and 9 is electrically connected to the corresponding external electrode 5.

As illustrated in FIGS. 3, 5, and 6, the external electrode 5 includes a first electrode layer E1, a second electrode layer E2, a third electrode layer E3, and a fourth electrode layer E4. The fourth electrode layer E4 is the outermost layer of the external electrode 5. Each of the electrode portions 5a, 5c, and 5e includes the first electrode layer E1, the second electrode layer E2, the third electrode layer E3, and fourth electrode layer E4. The electrode portion 5b includes the first electrode layer E1, the third electrode layer E3, and the fourth electrode layer E4.

The first electrode layer E1 included in the electrode portion 5a is disposed on the ridge portion 3g, and is not disposed on the principal surface 3a. In the present embodiment, the first electrode layer E1 included in the electrode portion 5a is in contact with the entire ridge portion 3g. The principal surface 3a is not covered with the first electrode layer E1, thereby being exposed from the first electrode layer E1. The second electrode layer E2 included in the electrode portion 5a is disposed on the first electrode layer E1 and on the principal surface 3a. The first electrode layer E1 is entirely covered with the second electrode layer E2. In the electrode portion 5a, the second electrode layer E2 is in contact with a part of the principal surface 3a and the entire first electrode layer E1. The electrode portion 5a is four-layered on the ridge portion 3g, and is three-layered on the principal surface 3a.

As described above, in a case in which an element is described as covering another element, the element may directly cover the other element or indirectly cover the other element. In a case in which an element is described as indirectly covering another element, an intervening element is present between the element and the other element. In a case in which an element is described as directly covering another element, no intervening element is present between the element and the other element.

The second electrode layer E2 included in the electrode portion 5a is formed to cover the entire ridge portion 3g and a part of the principle surface 3a. The second electrode layer E2 included in the electrode portion 5a indirectly covers the entire ridge portion 3g in such a manner that the first electrode layer E1 is located between the second electrode layer E2 and the ridge portion 3g. The second electrode layer E2 included in the electrode portion 5a directly covers the part of the principle surface 3a. The second electrode layer E2 included in the electrode portion 5a directly covers an entire portion of the first electrode layer E1 formed on the ridge portion 3g.

The first electrode layer E1 included in the electrode portion 5b is disposed on the ridge portion 3h, and is not disposed on the principal surface 3b. In the present embodiment, the first electrode layer E1 included in the electrode portion 5b is in contact with the entire ridge portion 3h. The principal surface 3b is not covered with the first electrode layer E1, thereby being exposed from the first electrode layer E1. The electrode portion 5b does not include the second electrode layer E2. The principal surface 3b is not covered with the second electrode layer E2, thereby being exposed from the second electrode layer E2. The electrode portion 5b is three-layered.

The first electrode layer E1 included in the electrode portion 5c is disposed on the ridge portion 3i, and is not disposed on the side surface 3c. In the present embodiment, the first electrode layer E1 included in the electrode portion 5c is in contact with the entire ridge portion 3i. The side surface 3c is not covered with the first electrode layer E1, thereby being exposed from the first electrode layer E1. The second electrode layer E2 included in the electrode portion 5c is disposed on the first electrode layer E1 and on the side surface 3c. A part of the first electrode layer E1 is covered with the second electrode layer E2. In the electrode portion 5c, the second electrode layer E2 is in contact with a part of the side surface 3c and a part of the first electrode layer E1.

The second electrode layer E2 included in the electrode portion 5c is formed to cover a part of the ridge portion 3i and a part of the side surface 3c. The second electrode layer E2 included in the electrode portion 5c indirectly covers the part of the ridge portion 3i in such a manner that the first electrode layer E1 is located between the second electrode layer E2 and the ridge portion 3i. The second electrode layer E2 included in the electrode portion 5c indirectly covers a region near the principle surface 3a of the ridge portion 3i. The second electrode layer E2 included in the electrode portion 5c directly covers the part of the side surface 3c. The second electrode layer E2 included in the electrode portion 5c directly covers a part of the portion of the first electrode layer E1 formed in the ridge portion 3i.

The electrode portion 5c includes a region $5c_1$ and a region $5c_2$. The region $5c_2$ is located closer to the principal surface 3a than the region $5c_1$. In the present embodiment, the electrode portion 5c includes only two regions $5c_1$, $5c_2$. The region $5c_1$ includes the first electrode layer E1, the third electrode layer E3, and the fourth electrode layer E4. The region $5c_1$ does not include the second electrode layer E2. The region $5c_1$ is three-layered. The region $5c_2$ includes the first electrode layer E1, the second electrode layer E2, the third electrode layer E3, and the fourth electrode layer E4. The region $5c_2$ is four-layered on the ridge portion 3i, and is three-layered on the side surface 3c. The region $5c_1$ is the region where the first electrode layer E1 is exposed from the second electrode layer E2. The region $5c_2$ is the region where the first electrode layer E1 is covered with the second electrode layer E2.

The first electrode layer E1 included in the electrode portion 5e is disposed on the end surface 3e. The end surface 3e is entirely covered with the first electrode layer E1. The first electrode layer E1 included in the electrode portion 5e is in contact with the entire end surface 3e. The second electrode layer E2 included in the electrode portion 5e is disposed on the first electrode layer E1. A part of the first electrode layer E1 is covered with the second electrode layer E2. In the electrode portion 5e, the second electrode layer E2 is in contact with the part of the first electrode layer E1. The second electrode layer E2 included in the electrode portion 5e is formed to cover a part of the end surface 3e. The second electrode layer E2 included in the electrode portion 5e indirectly covers the part of the end surface 3e in such a manner that the first electrode layer E1 is located between the second electrode layer E2 and the end surface 3e. The second electrode layer E2 included in the electrode portion 5e directly covers a part of the portion of the first electrode layer E1 formed on the end surface 3e.

The electrode portion 5e includes a region $5e_1$ and a region $5e_2$. The region $5e_2$ is located closer to the principal surface 3a than the region $5e_1$. In the present embodiment, the electrode portion 5e includes only two regions $5e_1$, $5e_2$. The region $5e_1$ includes the first electrode layer E1, the third electrode layer E3, and the fourth electrode layer E4. The region $5e_1$ does not include the second electrode layer E2. The region $5e_1$ is three-layered. The region $5e_2$ includes the first electrode layer E1, the second electrode layer E2, the third electrode layer E3, and the fourth electrode layer E4. The region $5e_2$ is four-layered. The region $5e_1$ is the region where the first electrode layer E1 is exposed from the second electrode layer E2. The region $5e_2$ is the region where the first electrode layer E1 is covered with the second electrode layer E2.

The first electrode layer E1 is formed by sintering conductive paste applied onto the surface of the element body 3. The first electrode layer E1 is formed to cover the end surface 3e and the ridge portions 3g, 3h, and 3i. The first electrode layer E1 is formed by sintering a metal component (metal powder) contained in the conductive paste. The first electrode layer E1 is a sintered metal layer. The first electrode layer E1 is a sintered metal layer formed on the element body 3. The first electrode layer E1 is not intentionally formed on the pair of principal surfaces 3a and 3b and the pair of side surfaces 3c. The first electrode layer E1 may be formed on the principal surfaces 3a and 3b and the side surfaces 3c due to a manufacturing error, for example.

In the present embodiment, the first electrode layer E1 is a sintered metal layer made of Cu. The first electrode layer E1 may be a sintered metal layer made of Ni. The first electrode layer E1 contains a base metal. The conductive paste contains, for example, powder made of Cu or Ni, a glass component, an organic binder, and an organic solvent.

The second electrode layer E2 is formed by curing conductive resin applied onto the first electrode layer E1, the principal surface 3a, and the pair of side surfaces 3c. The second electrode layer E2 is fainted over the first electrode layer E1 and the element body 3. The second electrode layer E2 covers a partial region of the first electrode layer E1. The second electrode layer E2 covers the regions, of the first electrode layer E1, corresponding to the electrode portion 5a, the region $5c_2$ of the electrode portion 5c, and the region $5e_2$ of the electrode portion 5e. The second electrode layer E2 directly covers a part of the ridge portion 3j. The second electrode layer is in contact with the part of the ridge portion 3j. The first electrode layer E1 serves as an underlying metal layer for forming the second electrode layer E2. The second electrode layer E2 is a conductive resin layer formed on the first electrode layer E1.

The conductive resin contains, for example, a resin, a conductive material, and an organic solvent. The resin is, for example, a thermosetting resin. The conductive material is, for example, metal powder. The metal powder is, for example, Ag powder or Cu powder. The thermosetting resin is, for example, a phenolic resin, an acrylic resin, a silicone resin, an epoxy resin, or a polyimide resin. Electric resistance of the second electrode layer E2 is larger than electric resistance of the first electrode layer E1.

The third electrode layer E3 is formed on the second electrode layer E2 and on the first electrode layer E1 by plating method. The third electrode layer E3 is formed on a portion of the first electrode layer E1 exposed from the second electrode layer E2. The third electrode layer E3 directly covers the second electrode layer E2 and the portion of the first electrode layer E1 exposed from the second electrode layer E2. In the present embodiment, the third electrode layer E3 is formed on the first electrode layer E1 and the second electrode layer E2 by Ni plating. The third electrode layer E3 is a Ni plating layer. The third electrode layer E3 may be an Sn plating layer, a Cu plating layer, or an Au plating layer. The third electrode layer E3 contains Ni, Sn, Cu, or Au.

The fourth electrode layer E4 is formed on the third electrode layer E3 by plating method. The fourth electrode layer E4 indirectly covers the second electrode layer E2 and the portion of the first electrode layer E1 exposed from the second electrode layer E2 in such a manner that the third electrode layer E3 is located between the fourth electrode layer E4 and the second electrode layer E2 and portion of the first electrode layer E1 exposed from the second electrode layer E2. In the present embodiment, the fourth electrode layer E4 is formed on the third electrode layer E3 by Sn plating. The fourth electrode layer E4 is an Sn plating layer. The fourth electrode layer E4 may be a Cu plating layer or an Au plating layer. The fourth electrode layer E4 contains Sn, Cu, or Au. The third electrode layer E3 and fourth electrode layer E4 form a plating layer disposed on the second electrode layer E2. In the present embodiment, the plating layer disposed on the second electrode layer E2 is a two-layered plating layer.

The first electrode layer E1 included in the electrode portion 5a, the first electrode layer E1 included in the electrode portion 5b, the first electrode layer E1 included in the electrode portion 5c, and the first electrode layer E1 included in the electrode portion 5e are integrally formed. The second electrode layer E2 included in the electrode portion 5a, the second electrode layer E2 included in the electrode portion 5c, and the second electrode layer E2 included in the electrode portion 5e are integrally formed. The third electrode layer E3 included in the electrode portion 5a, the third electrode layer E3 included in the electrode portion 5b, the third electrode layer E3 included in the electrode portion 5c, and the third electrode layer E3 included in the electrode portion 5e are integrally formed. The fourth electrode layer E4 included in the electrode portion 5a, the fourth electrode layer E4 included in the electrode portion 5b, the fourth electrode layer E4 included in the electrode portion 5c, and the fourth electrode layer E4 included in the electrode portion 5e are integrally formed.

Each of the first electrode layers E1 (first electrode layers E1 included in the electrode portions 5e) is formed on the end surface 3e to be connected to the respective internal electrodes 7 and 9. The first electrode layer E1 covers the entire end surface 3e, the entire ridge portion 3g, the entire ridge portion 3h, and the entire ridge portion 3i. The second electrode layer E2 (second electrode layer E2 included in the electrode portions 5a, 5c, and 5e) continuously covers a part of the principle surface 3a, a part of the end surface 3e, and a part of each of the pair of side surfaces 3c. The second electrode layer E2 integrally covers a region near the end surface 3e of the principle surface 3a, a region near the principle surface 3a of the end surface 3e, and a region near the principle surface 3a of the side surface 3c.

The second electrode layer E2 (second electrode layer E2 included in the electrode portions 5a, 5c, and 5e) covers the entire ridge portion 3g, a part of the ridge portion 3i, and a part of the ridge portion 3j. The second electrode layer E2 covers the entire ridge portion 3g, the part of the ridge portion 3i, and the part of the ridge portion 3j in such a manner that the first electrode layer E1 is located between the second electrode layer E2 and the ridge portions 3g, 3i, and 3j. The second electrode layer E2 directly covers the entire portion formed on the ridge portion 3g, a part of the portion formed on the ridge portion 3i, and a part of the portion formed on the ridge portion 3j, of the first electrode layer E1. The second electrode layer E2 includes a plurality of portions each corresponding to the part of the principle surface 3a, the part of the end surface 3e, the part of each of the pair of side surfaces 3c, the entire ridge portion 3g, the part of the ridge portion 3i, and the part of the ridge portion 3j.

The first electrode layer E1 (first electrode layer E1 included in the electrode portions 5a, 5b, 5c, and 5e) includes a region covered with the second electrode layer E2 (second electrode layer E2 included in the electrode portions 5a, 5c, and 5e), and a region not covered with the second electrode layer E2 (second electrode layer E2 included in the electrode portions 5a, 5c, and 5e). The region not covered with the second electrode layer E2 is a region exposed from the second electrode layer E2. The third electrode layer E3 and the fourth electrode layer E4 cover a region of the first electrode layer E1 not covered with the second electrode layer E2 and the second electrode layer E2. The first electrode layer E1 (first electrode layer E1 included in the electrode portion 5e) is directly connected to the respective internal electrodes 7 and 9.

As illustrated in FIG. 4, a thickness of the second electrode layer E2 gradually increases from the principle surface 3b toward the principle surface 3a in the first direction D1. The thickness of the second electrode layer E2 is, for example, the shortest distance between the first electrode layer E1 and the third electrode layer E3. The thickness of the second electrode layer E2 is, for example, the thickness of the second electrode layer E2 in the normal direction of the surface in contact with the second electrode layer E2 of the first electrode layer E1.

The second electrode layer E2 includes a thickest portion E2m. The thickest portion E1m is the portion where the second electrode layer E2 has a maximum thickness. The thickest portion E2m is located near the principle surface 3a in the first direction D1. The thickest portion E2m is located nearer to the principle surface 3a than the principle surface 3b in the first direction D1. The thickest portion E2m is located nearer to the principle surface 3a than the principle surface 3b in the first direction D1, in the second electrode layer E2. For example, a distance between a virtual plane including the principle surface 3a and the thickest portion E2m in the first direction D1 is smaller than a distance between a virtual plane including the principle surface 3b and the thickest portion E2m in the first direction D1. For example, the distance between the virtual plane including the principle surface 3a and the thickest portion E2m in the first direction D1 is smaller than a distance between a virtual plane including the end edge E2e near the principle surface 3b of the second electrode layer E2 (see FIG. 9) and in parallel with the principle surface 3b and the thickest portion E2m in the first direction D1.

The second electrode layer E2 includes a ridge portion E2r covering the ridge portion 3g of the element body 3. The ridge portion E2r indirectly covers the ridge portion 3g. The ridge portion E2r is located nearer to the principle surface 3a than the thickest portion E2m in the first direction D1. In the second electrode layer E2, the ridge portion E2r is located nearer to the principle surface 3a than the thickest portion E2m in the first direction D1. For example, a distance between the virtual plane including the principle surface 3a and the ridge portion E2r in the first direction D1 is smaller than the distance between the virtual plane including the principle surface 3a and the thickest portion E2m in the first direction D1.

A thickness Mb of the ridge portion E2r is smaller than a thickness Ma of the thickest portion E2m. The thickness Mb gradually decreases in a direction from the principle surface 3b along the first direction D1 to the principle surface 3a. The thickness Mb is smaller than the thickness Ma at any position in the first direction D1 in the ridge portion E2r. As described above, the thickness of the second electrode layer E2 is a maximum at the thickest portion E2m. For example, the thickness of the second electrode layer E2 gradually increases from the end edge E2e located near the principle surface 3b toward the thickest portion E2m in the first direction D1. For example, the thickness of the second electrode layer E2 gradually decreases toward the principle surface 3a at the ridge portion E2r beyond the thickest portion E2m.

The ridge portion E2r has a rounded shape to achieve a predetermined curvature radius. Since the thickness Mb is smaller than the thickness Ma, a degree of roundness of the ridge portion E2r is small, or a curvature radius R2 of the ridge portion E2r is large, as compared with a configuration in which the thickness Mb is greater than or equal to the thickness Ma. The curvature radius R2 is larger than a curvature radius R1 of the ridge portion 3g. The degree of roundness of the ridge portion E2r is smaller than a degree of rounding of the ridge portion 3g. The third electrode layer E3 and fourth electrode layer E4 are formed by plating method along the surface of the second electrode layer E2. Therefore, a curvature radius of the portion covering the ridge portion E2r of the second electrode layer E2 of the third electrode layer E3 and fourth electrode layer E4 is substantially equal to the curvature radius R2. A curvature radius of a ridge portion B1 near the principle surface 3a in the external electrode 5 is substantially equal to the curvature radius R2. Like the curvature radius R2, the curvature radius of the ridge portion B1 is larger than the curvature radius R1.

As illustrated in FIG. 7, when viewed from the first direction D1, the entire portion of the first electrode layer E1 (first electrode layer E1 included in the electrode portion 5a) is covered with the second electrode layer E2. When viewed from the first direction D1, the first electrode layer E1 (first electrode layer E1 included in the electrode portion 5a) is not exposed from the second electrode layer E2.

As illustrated in FIG. 8, when viewed in the second direction D2, the end region near the principle surface 3a of the first electrode layer E1 is covered with the second electrode layer E2. The end region near the principle surface 3a of the first electrode layer E1 includes the first electrode layer E1 included in the region $5c_2$. When viewed from the second direction D2, the end edge E2e of the second electrode layer E2 crosses the end edge E1e of the first electrode layer E1. When viewed from the second direction D2, the end region near the principle surface 3b of the first electrode layer E1 is exposed from the second electrode layer E2. The end region near the principle surface 3b of the first electrode layer E1 includes the first electrode layer E1 included in the region $5c_1$. An area of the second electrode layer E2 located on the side surface 3c and the ridge portion 3i is larger than an area of the first electrode layer E1 located on the ridge portion 3i.

As illustrated in FIG. 9, when viewed from the third direction D3, the end region near the principle surface 3a of the first electrode layer E1 is covered with the second electrode layer E2. The end region near the principle surface 3a of the first electrode layer E1 includes the first electrode layer E1 included in the region $5e_2$. When viewed from the third direction D3, the end edge E2e of the second electrode layer E2 is located on the first electrode layer E1. When viewed from the third direction D3, the end region near the principle surface 3b of the first electrode layer E1 is exposed from the second electrode layer E2. The end region near the principle surface 3b of the first electrode layer E1 includes the first electrode layer E1 included in the region $5e_1$. An area of the second electrode layer E2 located on the end surface 3e and the ridge portion 3g is smaller than an area of the first electrode layer E1 located on the end surface 3e and the ridge portion 3g.

In the present embodiment, the second electrode layer E2 continuously covers only the part of the principle surface 3a, only the part of the end surface 3e, and only the part of each of the pair of side surfaces 3c. The second electrode layer E2 covers the entire ridge portion 3g, only the part of the ridge portion 3i, and only the part of the ridge portion 3j. The part of a portion, of the first electrode layer E1, covering the ridge portion 3i is exposed from the second electrode layer E2. For example, the first electrode layer E1 included in the region $5c_1$ is exposed from the second electrode layer E2.

As illustrated in FIG. 2, a width of the region $5c_2$ in a third direction D3 decreases with an increase in distance from the principal surface 3a. The width of the region $5c_2$ in a third direction D3 decreases with an increase in distance from the electrode portion 5a. A width of the region $5c_2$ in a first direction D1 decreases with an increase in distance from the end surface 3e. The width of the region $5c_2$ in a first direction D1 decreases with an increase in distance from the electrode portion 5e. In the present embodiment, an end edge of the region $5c_2$ has a substantially arc shape when viewed from a second direction D2. The region $5c_2$ has a substantially fan shape when viewed from a second direction D2. In the present embodiment, as illustrated in FIG. 8, the width of the second electrode layer E2 viewed from the second direction D2 decreases with an increase in distance from the principal surface 3a. An end edge E2e of the second electrode layer E2 has a substantially arc shape.

Figure 10:
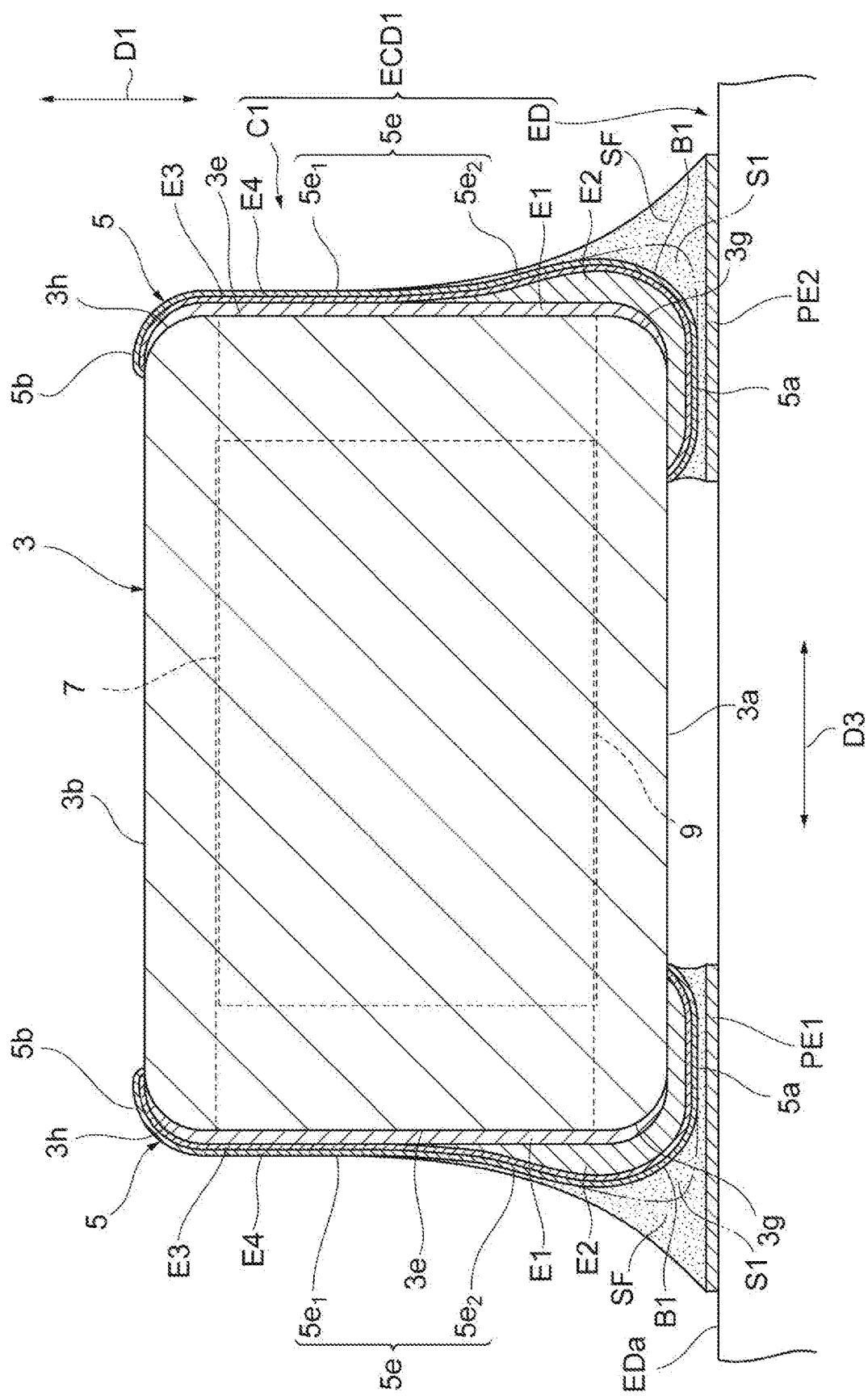
FIG. 10 is a view illustrating a mounted structure of the multilayer capacitor according to the first embodiment.

Next, a mounted structure of the multilayer capacitor C1 will be described with reference to FIG. 10. FIG. 10 is a view illustrating a mounted structure of a multilayer capacitor according to the first embodiment.

As illustrated in FIG. 10, an electronic component device ECD1 includes the multilayer capacitor C1 and an electronic device ED. The electronic device ED includes, for example, a circuit board or an electronic component.

The multilayer capacitor C1 is solder-mounted on the electronic device ED. The electronic device ED includes a principal surface EDa and a plurality of pad electrodes PE1 and PE2. In the present embodiment, the electronic device ED includes two pad electrodes PE1 and PE2. Each of the pad electrodes PE1 and PE2 is disposed on the principal surface EDa. The two pad electrodes PE1 and PE2 are spaced apart from each other. The multilayer capacitor C1 is disposed on the electronic device ED in such a manner that the principal surface 3a and the principal surface EDa oppose each other. As described above, the principal surface 3a is arranged to constitute a mounting surface.

When the multilayer capacitor C1 is solder-mounted, molten solder wets to the external electrodes 5 (fourth electrode layer E4). Solder fillets SF are formed on the external electrodes 5 by solidification of the wet solder. The external electrodes 5 and the pad electrodes PE1 and PE2 corresponding to each other are coupled via the solder fillets SF.

The solder fillet SF is formed on the regions $5e_1$ and $5e_2$ of the electrode portion 5e. That is, in addition to the region $5e_2$, the region $5e_1$ that does not include the second electrode layer E2 is also coupled to pad electrodes PE1 and PE2 via the solder fillet SF. Although illustration is omitted, the solder fillet SF is also formed on the regions $5c_1$ and $5c_2$ of the electrode portion 5c. The solder fillet SF overlaps the region of the first electrode layer E1 exposed from the second electrode layer E2 when viewed from the third direction D3.

In the electronic component device ECD1, as described above, the electrode layer E2 tends not to peel off from the element body and the moisture resistance reliability is improved.

When viewed from the third direction D3, the solder fillet SF overlaps the region of the first electrode layer E1 exposed from the second electrode layer E2. The region of the first electrode layer E1 exposed from the second electrode layer E2 is electrically connected to the electronic device ED via the solder fillet SF. The region of the first electrode layer E1 exposed from the second electrode layer E2 is electrically connected to the electronic device ED without passing through the second electrode layer E2. Therefore, the electronic component device ECD1 suppresses the increase of the ESR even in a case where the external electrode 5 includes the second electrode layer E2.

Like the curvature radius R2, as described above, the curvature radius of the ridge portion B1 of the external electrode 5 is larger than the curvature radius R1 of the ridge portion 3g (see FIGS. 3 and 4). The ridge portion B1 has a shape rounded such that the curvature radius of the ridge portion B1 is larger than the curvature radius R1. Therefore, as illustrated in FIG. 10, a region Si where the solder tends to accumulate is formed around the ridge portion B1 in proportion to the rounded ridge portion B1. The region Si is arranged to constitute a solder pool.

In a case where the multilayered capacitor C1 is solder-mounted on the electronic device ED, an external force applied onto the multilayered capacitor C1 from the electronic device ED may act as a stress on the element body 3. The external force acts on the element body 3 from the solder fillet SF through the external electrode 5. In this case, a crack may occur in the element body 3.

In the multilayered capacitor C1, the second electrode layer E2 is formed on the end surface 3e. Therefore, even in a case where the external force acts on the multilayered capacitor C1 from the electronic device ED, the second electrode layer E2 absorbs the external force. Consequently, the multilayered capacitor C1 suppresses the occurrence of the crack in the element body 3.

In a case where thermal shock stress acts on the solder fillet SF, the crack may occur in the solder fillet SF. The thermal shock stress tends to be concentrated in the region near the principle surface 3a in the solder fillet SF.

In the multilayered capacitor C1, the second electrode layer E2 absorbs thermal shock stress. The thickness of the second electrode layer E2 gradually increases from the principle surface 3b toward the principle surface 3a in the first direction D1, and the thickest portion E2m is located near the principle surface 3a in the first direction D1. The thickest portion E2m is highly effective in absorbing the thermal shock stress than other portions of the second electrode layer E2. Therefore, the thermal shock stress tends not to be concentrated in the region near the principle surface 3a in the solder fillet SF. Consequently, the multilayered capacitor C1 suppresses occurrence of a crack in the solder fillet SF.

In the multilayered capacitor C1, the thickest portion E2m is located nearer to the principle surface 3a than the principle surface 3b in the first direction D1. Therefore, the second electrode layer E2 effectively absorbs the thermal shock stress concentrated in the region near the principle surface 3a of the solder fillet SF. Consequently, the multilayered capacitor C1 reliably suppresses the occurrence of the crack in the solder fillet SF.

In the multilayered capacitor C1, the thickest portion E2m is located nearer to the principle surface 3a than the principle surface 3b in the first direction D1, in the second electrode layer E2. Therefore, the second electrode layer E2 effectively absorbs the thermal shock stress concentrated in the region near the principle surface 3a of the solder fillet SF. Consequently, the multilayered capacitor C1 reliably suppresses the occurrence of the crack in the solder fillet SF.

In the multilayered capacitor C1, the second electrode layer E2 includes the ridge portion E2r covering the ridge portion 3g. The ridge portion E2r is located nearer to the principle surface 3a than the thickest portion E2m in the first direction D1. The thickness Mb of the ridge portion E2r is smaller than the thickness Ma of the thickest portion E2m.

In the multilayered capacitor C1, the curvature radius R2 of the ridge portion E2r is large, as compared with a configuration in which the thickness Mb is equal to or greater than the thickness Mb. Therefore, the curvature radius of the ridge portion B1 of the external electrode 5 is also large. Consequently, the multilayered capacitor C1 improves flexibility of the multilayered capacitor C1 and further reliably suppresses the occurrence of the crack in the element body 3.

Since the thickness Mb is smaller than the thickness Ma, the solder tends to accumulate at a position corresponding to the ridge portion B1 of the external electrode 5. Therefore, the multilayered capacitor C1 can provide the solder pool.

The second electrode layer E2 covers the region near the principle surface 3a of the end surface 3e. A region between the element body 3 and the second electrode layer E2 may act as a path through which moisture infiltrates. In a case where moisture infiltrates from the region between the element body 3 and the second electrode layer E2, durability of the multilayered capacitor C1 decreases. The multilayered capacitor C1 includes few paths through which moisture infiltrates, as compared with a configuration in which the second electrode layer E2 covers the entire end surface 3e. Therefore, the multilayered capacitor C1 improves the moisture resistance reliability.

In a case where the multilayer capacitor C1 is solder-mounting on the electronic device, the external force applied onto the multilayer capacitor C1 from the electronic device may act as the stress on the element body. The external force acts on the element body 3 from the solder fillet formed at the solder-mounting, through the external electrode 5. The external force tends to act on the region near the end surface 3e of the principle surface 3a of the element body 3. In the configuration in which the second electrode layer E2 covers the region near the end surface 3e of the principle surface 3a, the external force applied onto the multilayer capacitor C1 from the electronic device tends not to act on the element body 3. Therefore, the multilayer capacitor C1 suppresses the occurrence of the crack in the element body 3.

The external electrode 5 includes the first electrode layer E1 formed on the end surface 3e to be connected to the respective internal electrodes 7 and 9. The first electrode layer E1 includes the region covered with the second electrode layer E2 and the region exposed from the second electrode layer E2. The first electrode layer E1 is favorably in contact with the respective internal electrodes 7 and 9. This allows reliable electrical connection between the external electrode 5 and the internal electrodes 7 and 9.

The electric resistance of the second electrode layer E2 is larger than electric resistance of the first electrode layer E1. In the multilayer capacitor C1, the region of the first electrode layer E1 exposed from the second electrode layer E2 is electrically connected to the electronic device without passing through the second electrode layer E2. Therefore, the multilayer capacitor C1 suppresses the increase of ESR even in a case where the external electrode 5 includes the second electrode layer E2.

In the multilayer capacitor C1, the external electrode 5 includes the third electrode layer E3 and fourth electrode layer E4. Therefore, the multilayer capacitor C1 can be solder-mounting on the electronic device.

The region of the first electrode layer E1 exposed from the second electrode layer E2 is electrically connected to the electronic device via the third electrode layer E3 and fourth electrode layer E4. Therefore, the multilayer capacitor C1 further suppresses the increase in the ESR.

Second Embodiment

Figure 11:
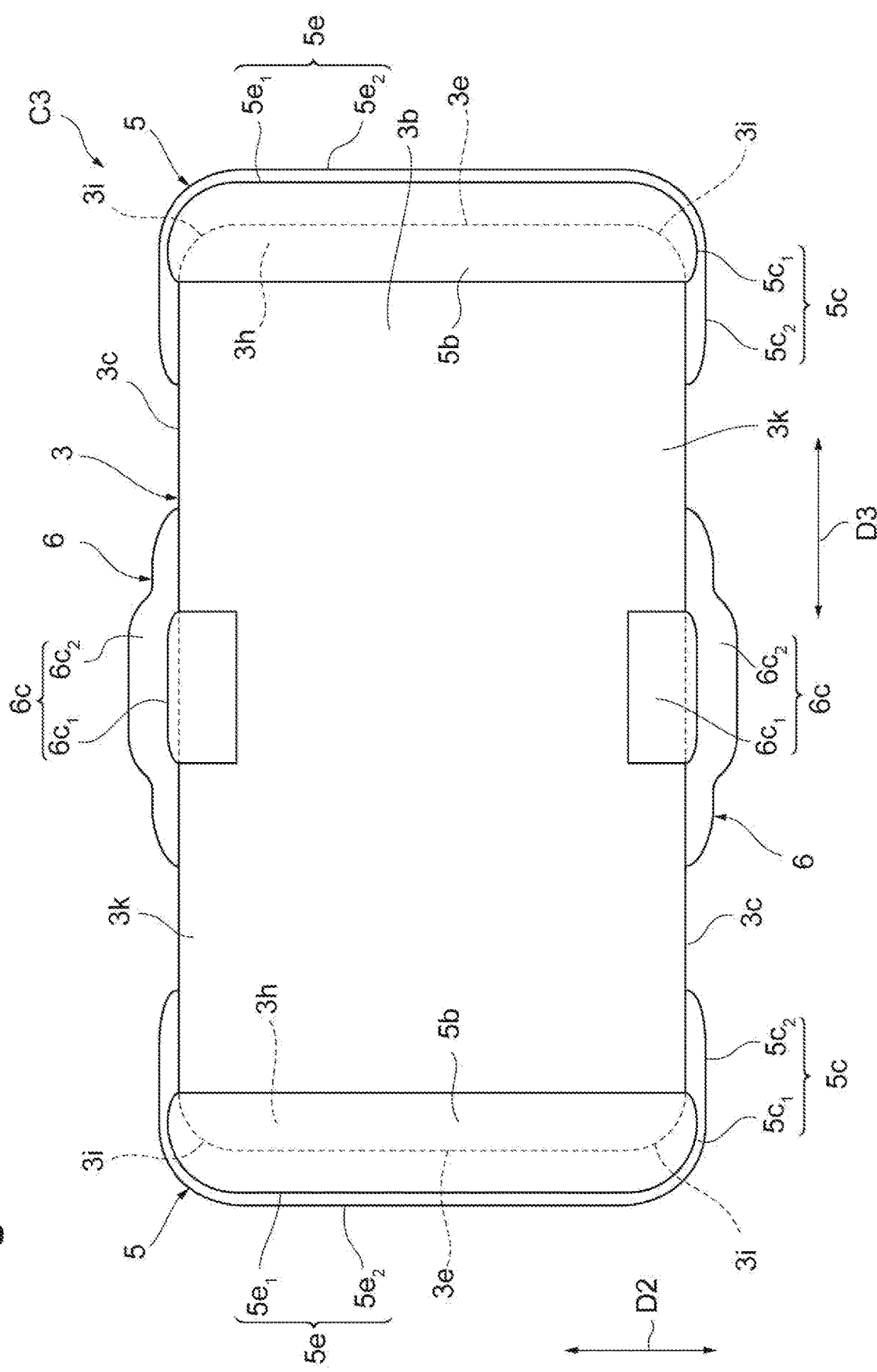
FIG. 11 is a plan view of a multilayer feedthrough capacitor according to a second embodiment.
Figure 12:
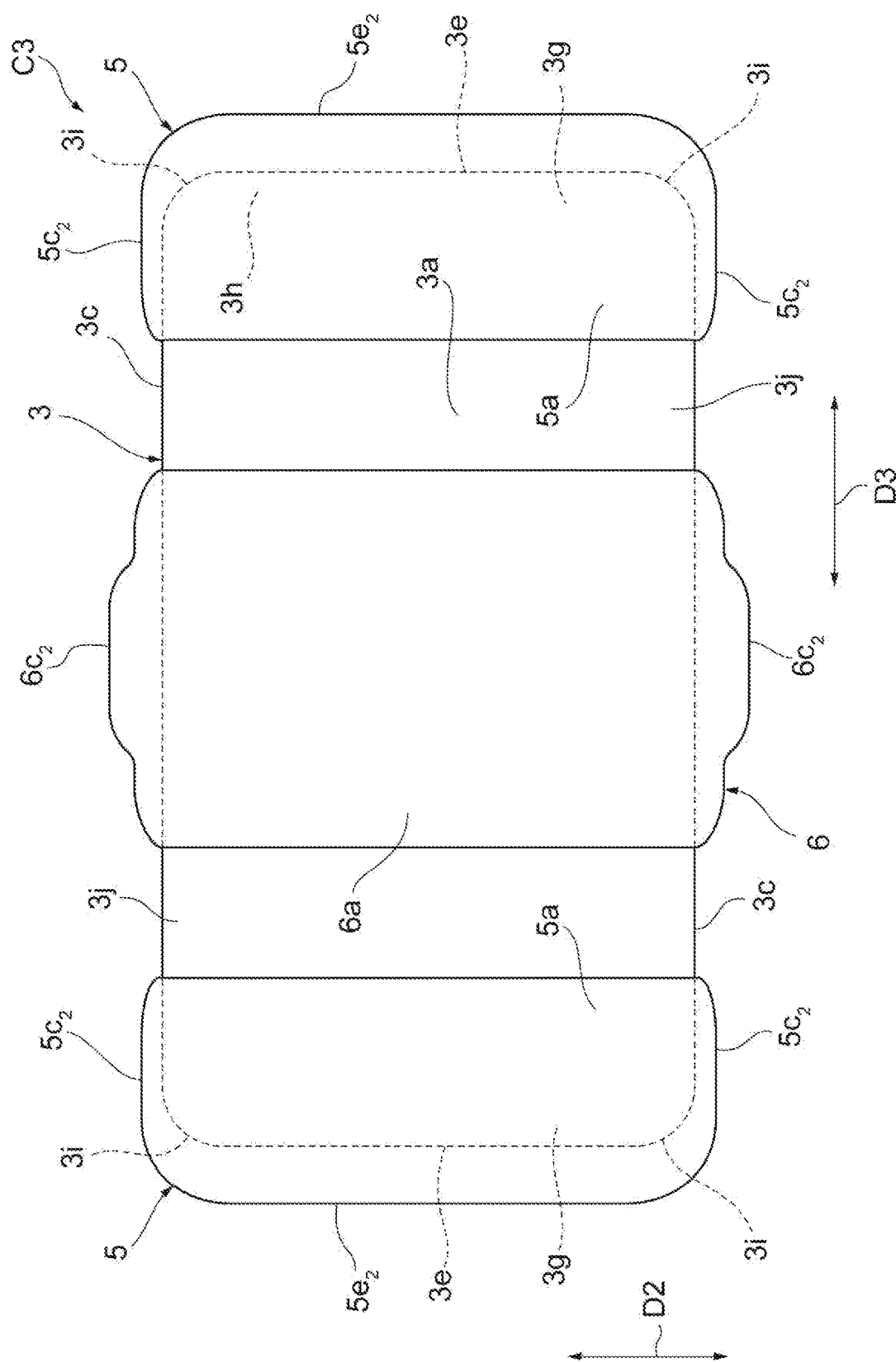
FIG. 12 is a plan view of the multilayer feedthrough capacitor according to the second embodiment.
Figure 13:
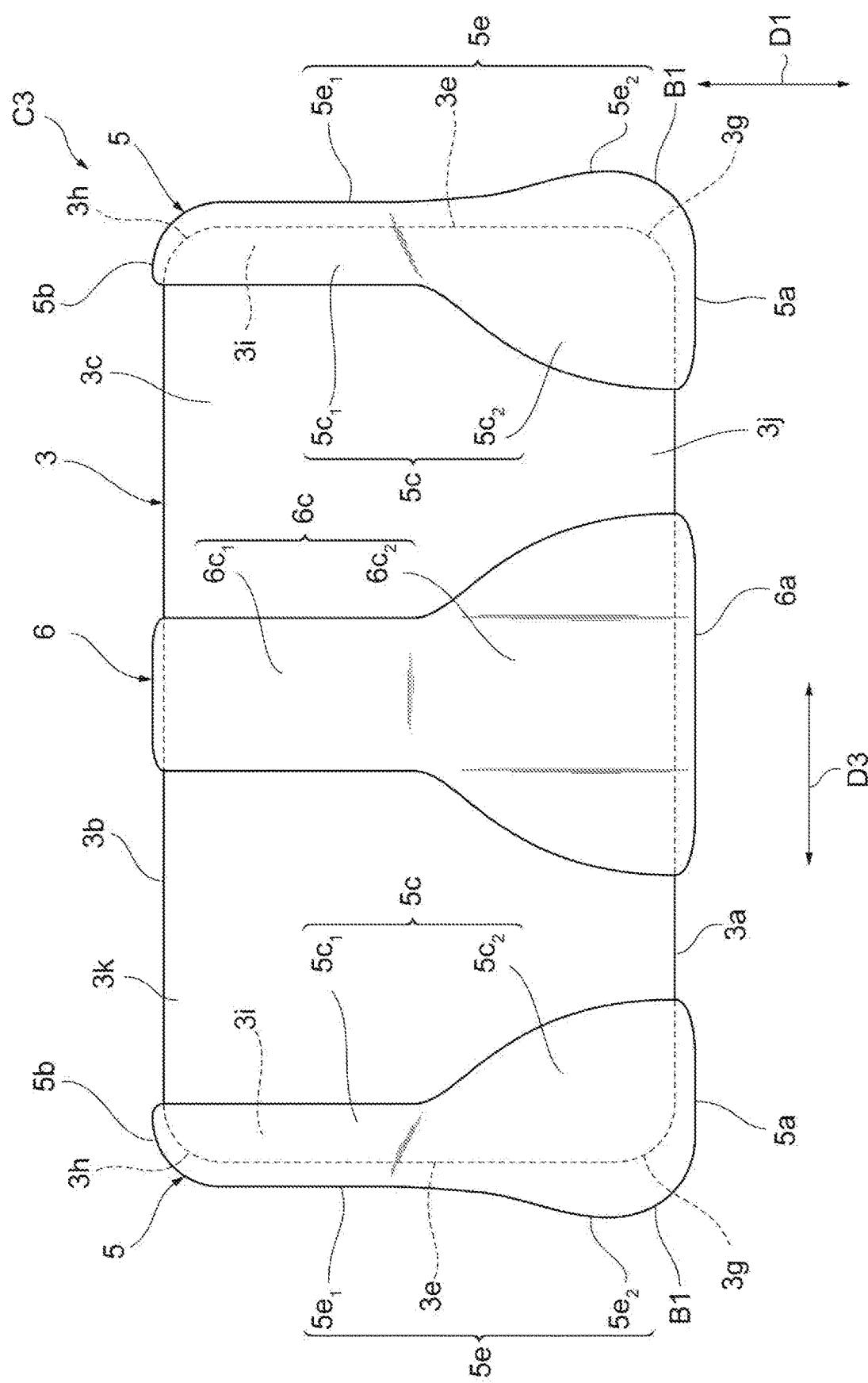
FIG. 13 is a side view of the multilayer feedthrough capacitor according to the second embodiment.
Figure 14:
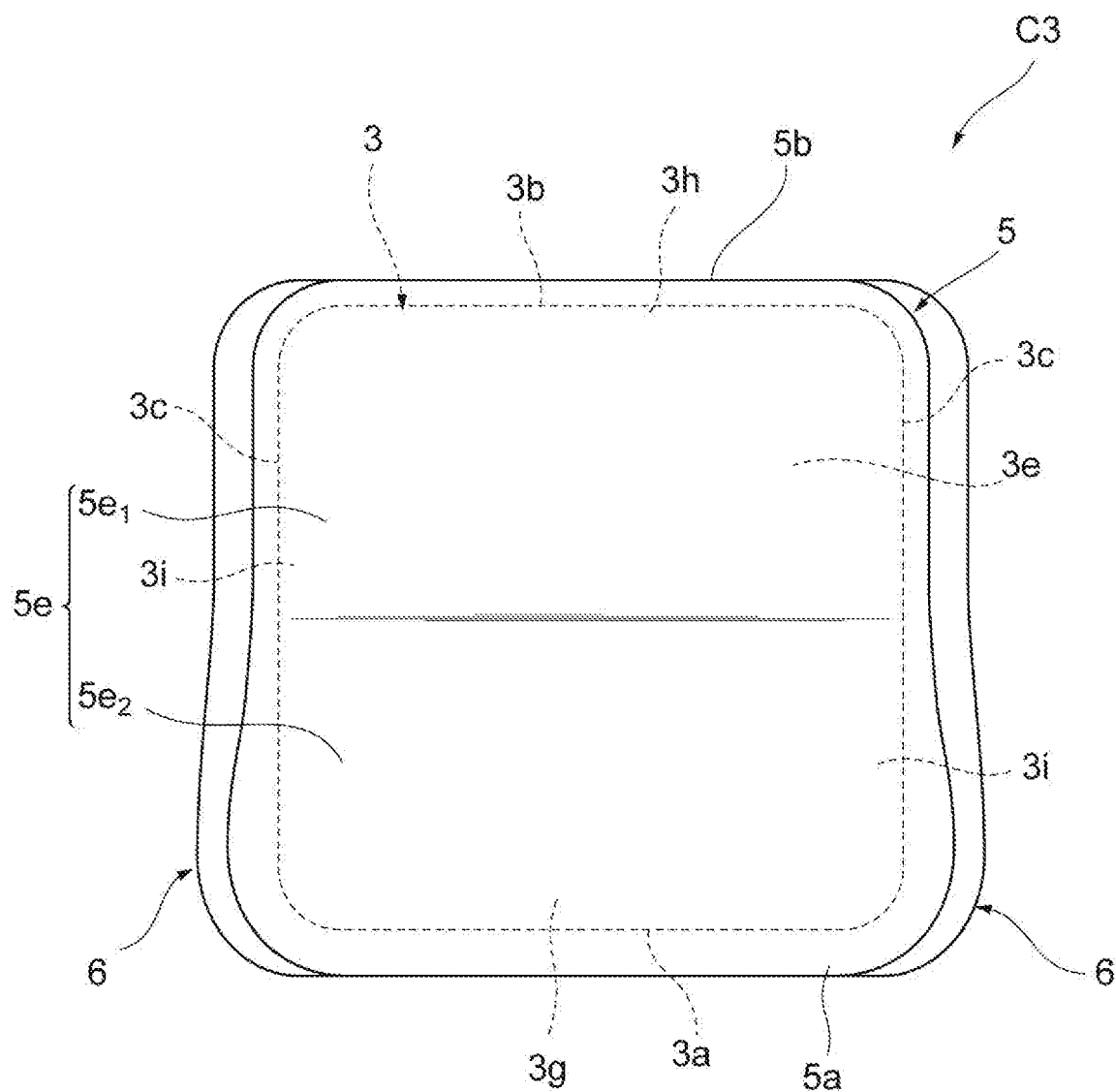
FIG. 14 is an end view of the multilayer feedthrough capacitor according to the second embodiment.
Figure 15:
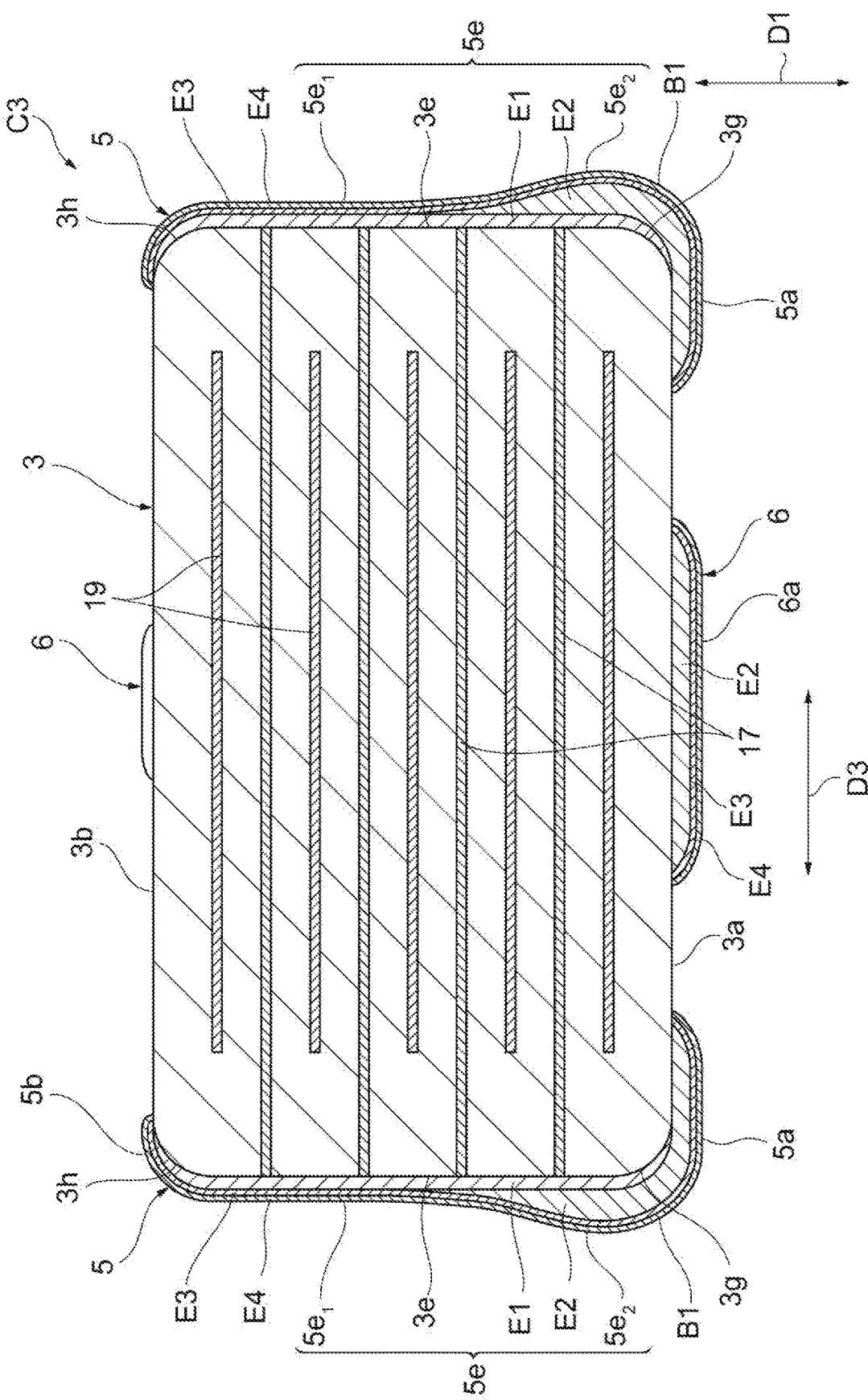
FIG. 15 is a view illustrating a cross-sectional configuration of the multilayer feedthrough capacitor according to the second embodiment.
Figure 16:
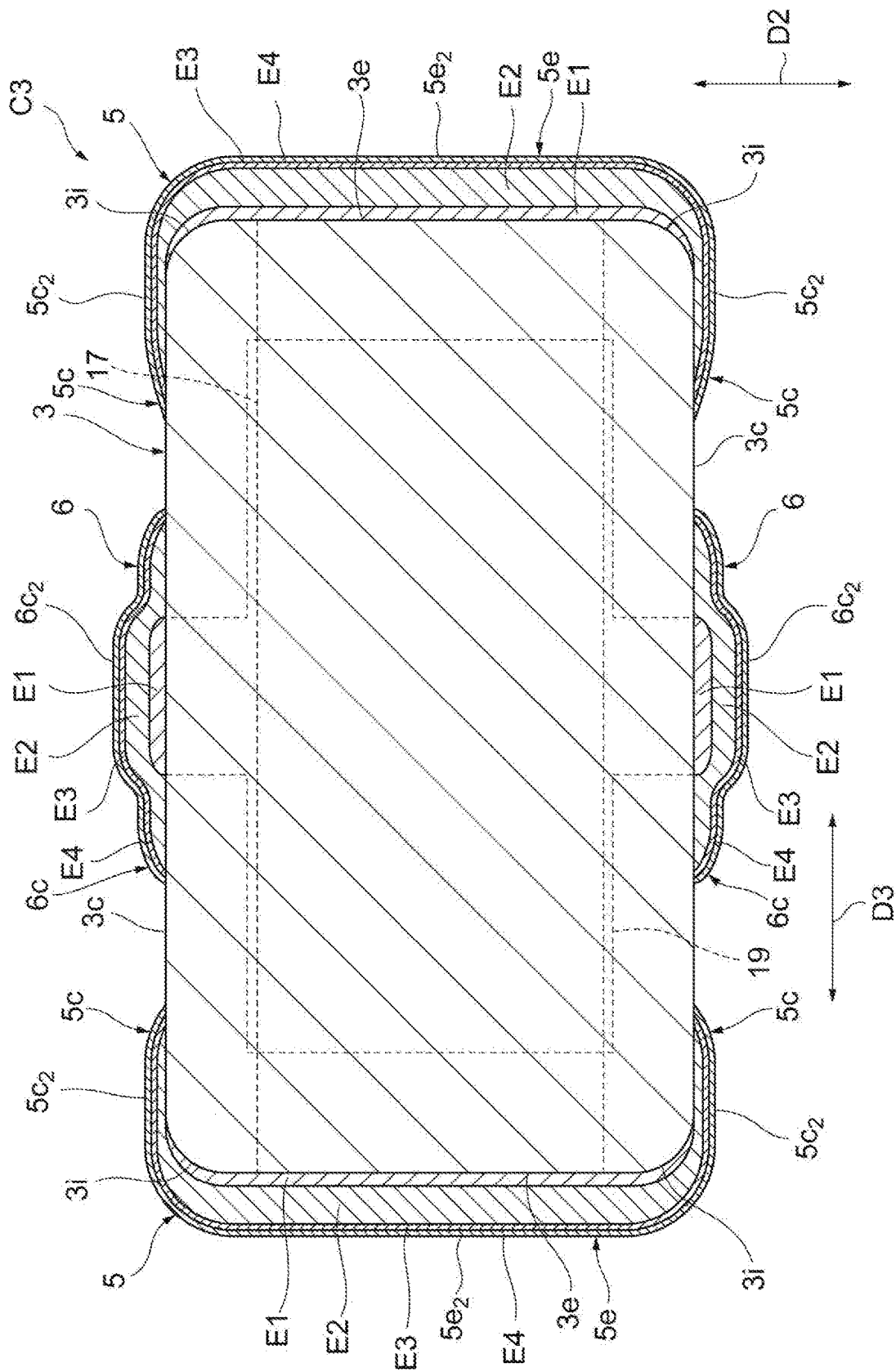
FIG. 16 is a view illustrating a cross-sectional configuration of the multilayer feedthrough capacitor according to the second embodiment.
Figure 17:
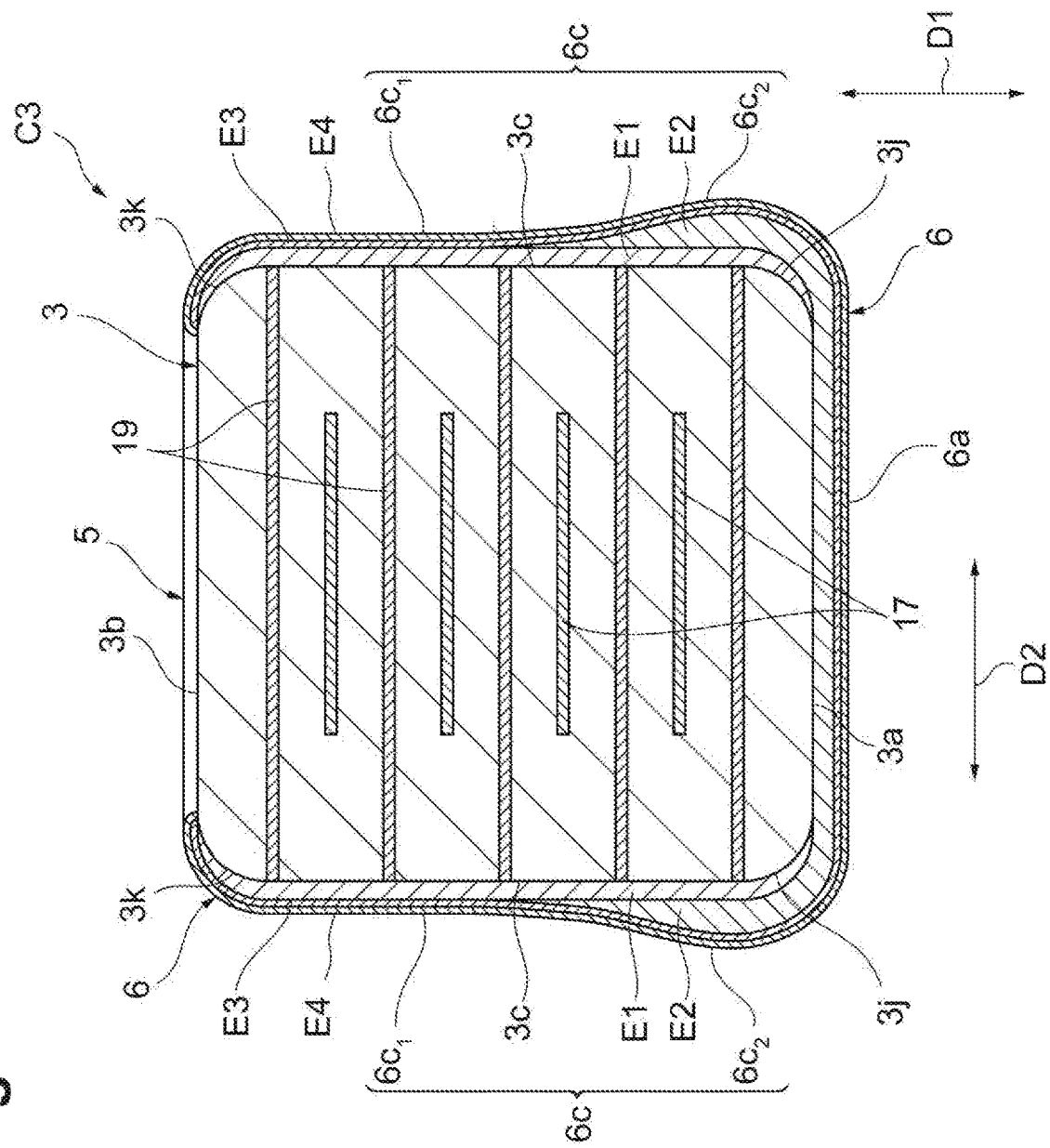
FIG. 17 is a view illustrating a cross-sectional configuration of the multilayer feedthrough capacitor according to the second embodiment.
Figure 18:
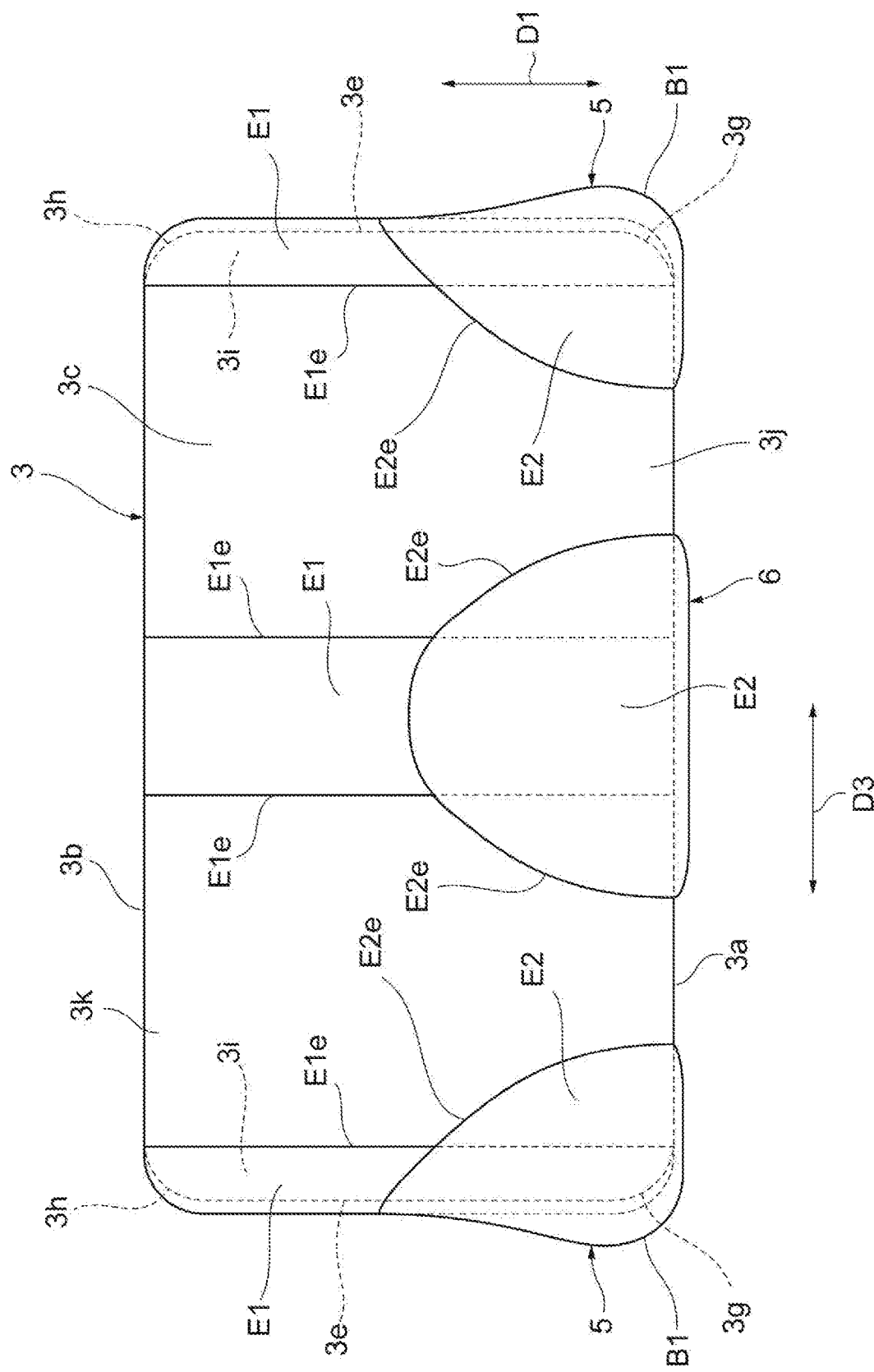
FIG. 18 is a side view illustrating an element body, a first electrode layer, and a second electrode layer.

With reference to FIGS. 11 to 18, a configuration of a multilayer feedthrough capacitor C3 according to a second embodiment will be described. FIGS. 11 and 12 are plan views of the multilayer feedthrough capacitor according to the second embodiment. FIG. 13 is a side view of the multilayer feedthrough capacitor according to the second embodiment. FIG. 14 is an end view of the multilayer feedthrough capacitor according to the second embodiment. FIGS. 15, 16, and 17 are views illustrating a cross-sectional configuration of the multilayer feedthrough capacitor according to the second embodiment. FIG. 18 is a side view illustrating an element body, a first electrode layer, and a second electrode layer. In the second embodiment, an electronic component is, for example, the multilayer feedthrough capacitor C3. Hereinafter, differences between the multilayer capacitor C1 and the multilayer feedthrough capacitor C3 will be mainly described.

As illustrated in FIGS. 11 to 14, the multilayer feedthrough capacitor C3 includes an element body 3, a pair of external electrodes 5, and one external electrode 6. The pair of external electrodes 5 and the one external electrode 6 are disposed on an outer surface of the element body 3. In the present embodiment, the element body 3 is configured by laminating a plurality of dielectric layers in the first direction D1. The pair of external electrodes 5 and the one external electrode 6 are separated from each other. The pair of external electrodes 5 is arranged to constitute signal terminal electrodes, and the external electrode 6 is arranged to constitute a ground terminal electrode.

As illustrated in FIGS. 15, 16, and 17, the multilayer feedthrough capacitor C3 includes a plurality of internal electrodes 17 and a plurality of internal electrodes 19. Each of the internal electrodes 17 and 19 is an internal conductor disposed in the element body 3. As with the internal electrodes 7 and 9, each of the internal electrodes 17 and 19 is made of a conductive material that is commonly used as an internal electrode of a multilayer electronic component. Also in the second embodiment, each of the internal electrodes 17 and 19 is made of Ni.

The internal electrode 17 and the internal electrode 19 are disposed in different positions (layers) in the first direction D1. The internal electrode 17 and the internal electrode 19 are alternately disposed in the element body 3 to oppose each other in the first direction D1 with an interval therebetween. Polarities of the internal electrode 17 and the internal electrode 19 are different from each other. In a case where a lamination direction of the plurality of dielectric layers is a second direction D2, the internal electrode 17 and the internal electrode 19 are disposed in different positions (layers) in the second direction D2. An end of the internal electrode 17 is exposed to a pair of end surfaces 3e. An end of the internal electrode 19 is exposed to a pair of side surfaces 3c.

As with the external electrodes 5 of the multilayer capacitor C1, the external electrodes 5 are disposed at both end portions of the element body 3 in a third direction D3. Each of the external electrodes 5 is disposed on the corresponding end surface 3e side of the element body 3. The external electrode 5 includes a plurality of electrode portions 5a, 5b, 5c, and 5e. The electrode portion 5a is disposed on the principal surface 3a and on the ridge portion 3g. The electrode portion 5b is disposed on the ridge portion 3h. The electrode portion 5c is disposed on each side surface 3c and on each ridge portion 3i. The electrode portion 5e is disposed on the corresponding end surface 3e. The external electrode 5 also includes a electrode portion disposed on the ridge portions 3j.

The electrode portion 5e covers all the ends exposed to the end surface 3e, of the internal electrode 17. The internal electrodes 17 are directly connected to each electrode portion 5e. The internal electrodes 17 are electrically connected to the pair of external electrodes 5.

The external electrode 6 is disposed on a central portion of the element body 3 in the third direction D3. The external electrode 6 is located between the pair of external electrode 5 in the third direction D3. The external electrode 6 includes an electrode portion 6a and a pair of electrode portions 6c. The electrode portion 6a is disposed on the principal surface 3a. Each of the electrode portions 6c is disposed on the side surface 3c and on the ridge portions 3j and 3k. The external electrode 6 is formed on the three surfaces, that is, the principal surface 3a and the pair of side surfaces 3c, as well as on the ridge portions 3j and 3k. The electrode portions 6a and 6c adjacent each other are coupled and are electrically connected to each other.

The electrode portion 6c covers all the ends exposed to the side surface 3c, of the internal electrode 19. The internal electrodes 19 are directly connected to each electrode portion 6c. The internal electrodes 19 are electrically connected to the one external electrode 6.

As illustrated in FIGS. 14, 15, and 16, the external electrode 6 includes a first electrode layer E1, a second electrode layer E2, a third electrode layer E3, and a fourth electrode layer E4. The fourth electrode layer E4 is the outermost layer of the external electrode 6. The electrode portion 6a includes the second electrode layer E2, the third electrode layer E3, and the fourth electrode layer E4. Each of the electrode portions 6c includes the first electrode layer E1, the second electrode layer E2, the third electrode layer E3, and the fourth electrode layer E4.

The first electrode layer E2 included in the electrode portion 6a is disposed on the principal surface 3a. The electrode portion 6a does not include the first electrode layer E1. The first electrode layer E2 included in the electrode portion 6a is in contact with the principal surface 3a. The electrode portion 6a is three-layered.

The first electrode layer E1 included in the electrode portion 6c is disposed on the side surface 3c and on the ridge portions 3j and 3k. The first electrode layer E2 included in the electrode portion 6c is disposed on the first electrode layer E1, on the side surface 3c, and on the ridge portion 3j. A part of the first electrode layer E1 is covered with the second electrode layer E2. The first electrode layer E2 included in the electrode portion 6c is in contact with the side surface 3c and the ridge portion 3j.

The electrode portion 6c includes a region $6c_1$ and a region $6c_2$. The region $6c_2$ is located closer to the principal surface 3a than the region $6c_1$. The region $6c_1$ includes the first electrode layer E1, the third electrode layer E3, and the fourth electrode layer E4. The region $6c_1$ does not include the second electrode layer E2. The region $6c_1$ is three-layered. The region $6c_2$ includes the first electrode layer E1, the second electrode layer E2, the third electrode layer E3, and the fourth electrode layer E4. The region $6c_2$ is four-layered. The region $6c_1$ is the region where the first electrode layer E1 is exposed from the second electrode layer E2. The region $6c_2$ is the region where the first electrode layer E1 is covered with the second electrode layer E2.

The first electrode layer E1 is formed to cover the side surface 3c and the ridge portion 3j and 3k. The first electrode layer E1 is not intentionally formed on the pair of principal surfaces 3a and 3b. The first electrode layer E1 may be formed on the principal surfaces 3a and 3b due to a manufacturing error, for example.

The second electrode layer E2 is formed over the first electrode layer E1 and the element body 3. The second electrode layer E2 covers a partial region of the first electrode layer E1. The second electrode layer E2 covers a region corresponding to the region $6c_2$ of the electrode portion 6c. The second electrode layer E2 covers a partial region of the principal surface 3a, a partial region of the side surface 3c, and a partial region of the ridge portion 3j.

The third electrode layer E3 is formed on the second electrode layer E2 and on the first electrode layer E1 by plating method. The third electrode layer E3 is formed on a portion of the first electrode layer E1 exposed from the second electrode layer E2. The fourth electrode layer E4 is formed on the third electrode layer E3 by plating method.

The second electrode layer E2 included in the electrode portion 6a and the second electrode layer E2 included in the electrode portion 6c are integrally formed. The third electrode layer E3 included in the electrode portion 6a and the third electrode layer E3 included in the electrode portion 6c are integrally formed. The fourth electrode layer E4 included in the electrode portion 6a and the fourth electrode layer E4 included in the electrode portion 6 are integrally formed.

With regard to the external electrode 6, as illustrated in FIG. 18, when viewed in the second direction D2, the end region near the principle surface 3a of the first electrode layer E1 is covered with the second electrode layer E2. The end region near the principle surface 3a of the first electrode layer E1 includes the first electrode layer E1 included in the region $6c_2$. When viewed from the second direction D2, the end edge E2e of the second electrode layer E2 crosses the end edge E1e of the first electrode layer E1. When viewed from the second direction D2, the end region near the principle surface 3b of the first electrode layer E1 is exposed from the second electrode layer E2. The end region near the principle surface 3b of the first electrode layer E1 includes the first electrode layer E1 included in the region $6c_1$.

As illustrated in FIG. 13, a width of the region $6c_2$ in a third direction D3 decreases with an increase in distance from the principal surface 3a. The width of the region $5c_2$ in a third direction D3 decreases with an increase in distance from the electrode portion 6a. In the present embodiment, an end edge of the region $6c_2$ has a substantially arc shape when viewed from a second direction D2. The region $6c_2$ has a substantially semicircular shape when viewed from a second direction D2. In the present embodiment, as illustrated in FIG. 18, the width of the second electrode layer E2 viewed from the second direction D2 decreases with an increase in distance from the principal surface $3a$. An end edge E2e of the second electrode layer E2 included in the region $6c_2$ has a substantially arc shape.

The multilayer feedthrough capacitor C3 is also solder-mounted on the electronic device. In the multilayer feedthrough capacitor C3, the principal surface $3a$ opposes the electronic device. The principal surface $3a$ is arranged to constitute a mounting surface.

The configuration of the external electrode 5 is the same as the configuration of the external electrode 5 of the first embodiment. In the second embodiment, a thickness of the second electrode layer E2 formed on the end surface $3e$ also gradually increases from the principle surface $3b$ toward the principle surface $3a$ in the first direction D1. The second electrode layer E2 includes a thickest portion E2m at a position near the principle surface $3a$ in the first direction D1. Like the multilayered capacitor C1, therefore, the multilayered feed-through capacitor C3 suppresses occurrence of a crack in the element body 3 and the solder fillet SF. In the second embodiment, illustration of a cross-sectional configuration of the external electrode 5 corresponding to the cross-sectional configuration illustrated in FIG. 4 is omitted.

In the multilayer feedthrough capacitor C3, when viewed in the second direction D2, the end region near the principle surface $3a$ of the first electrode layer E1 is covered with the second electrode layer E2 with regard to the external electrode 6. Therefore, the stress tends not to concentrate on the end edge of the first electrode layer E1 included in the region $6c_2$. Consequently, the multilayer feedthrough capacitor C3 suppresses occurrence of a crack in the element body 3.

In the region $6c_1$ of the electrode portion $6c$, the first electrode layer E1 is exposed from the second electrode layer E2. The region $6c_1$ does not include the second electrode layer E2. In region $6c_1$, the first electrode layer E1 is electrically connected to the electronic device without passing through the second electrode layer E2. Therefore, the multilayer feedthrough capacitor C3 suppresses an increase of ESR.

The region $6c_2$ of the electrode portion $6c$ includes the second electrode layer E2. Therefore, the stress tends not to concentrate on the end edge of the external electrode 6 even in the case where the external electrode 6 includes the electrode portion $6c$. The end edge of the external electrode 6 tends not to serve as an origination of a crack. Consequently, the multilayer feedthrough capacitor C3 reliably suppresses the occurrence of a crack in the element body 3.

The end edge of the region $6c_2$ may be substantially linear. The end edge of the region $6c_2$ may include a side extending in the third direction D3 and a side extending in the first direction D1. The end edge of the region $6c_2$ includes the end edge E2e of the second electrode layer E2.

Although the embodiments and modifications of the present invention have been described above, the present invention is not necessarily limited to the embodiments and modifications, and the embodiment can be variously changed without departing from the scope of the invention.

In the first and second embodiments, the second electrode layer E2 covers a part of the end surface $3e$. The second electrode layer E2 covers a region near the principle surface $3a$. The configuration of the second electrode layer E2 may include another configuration other than those described above. The second electrode layer E2 may cover at least the part of the end surface $3e$. The second electrode layer E2 may cover the entire end surface $3e$. The second electrode layer E2 may cover the ridge portion $3h$. The second electrode layer E2 may cover a part of the principle surface $3b$ to extend beyond the ridge portion $3h$ entirely or partially from the end surface $3e$. The second electrode layer E2 may cover the entire ridge portion $3i$. The second electrode layer E2 may cover a part of the side surface $3c$ to extend beyond the entire ridge portion $3i$ from the end surface $3e$.

In the first and second embodiments, the thickest portion E2m is located nearer to the principle surface $3a$ than the principle surface $3b$ in the first direction D1. The thickest portion E2m is located nearer to the principle surface $3a$ than the principle surface $3b$ in the first direction D1, in the second electrode layer E2. The thickest portion E2m may be located at a position other than the above-mentioned position. The thickest portion E2m may not be located nearer to the principle surface $3a$ than the principle surface $3b$ in the first direction D1, in the second electrode layer E2.

The first electrode layer E1 may be formed on the principle surface $3a$ to extend beyond the ridge portion $3g$ entirely or partially from the end surface $3e$. The first electrode layer E1 may be formed on the principle surface $3b$ to extend beyond the ridge portion $3h$ entirely or partially from the end surface $3e$. The first electrode layer E1 may be formed on the side surface $3c$ to extend beyond the ridge portion $3i$ entirely or partially from the end surface $3e$.

The electronic component of the first embodiment is a multilayer capacitor C1. The electronic component of the second embodiment is a multilayer feedthrough capacitor C3. Applicable electronic components are not limited to multilayer capacitors and multilayer feedthrough capacitors. Examples of the applicable electronic components include, but not limited to, multilayer electronic components such as a multilayer inductor, a multilayer varistor, a multilayer piezoelectric actuator, a multilayer thermistor, or a multilayer electronic component, and electronic components other than the multilayer electronic components.

What is claimed is:

1. An electronic component, comprising:
    an element body of a rectangular parallelepiped shape including a first principal surface arranged to constitute a mounting surface, a second principal surface opposing the first principal surface in a first direction, a pair of side surfaces opposing each other in a second direction, and a pair of end surfaces opposing each other in a third direction;
    a plurality of external electrodes disposed at both end portions of the element body in the third direction; and
    an internal conductor exposed to a corresponding end surface of the pair of end surfaces, wherein
    the external electrodes include (1) a sintered metal layer on the corresponding end surface that is connected to the internal conductor and (2) a conductive resin layer on the corresponding end surface,
    a thickness of the conductive resin layer gradually increases from the second principal surface toward the first principal surface in the first direction, and the conductive resin layer includes a thickest portion having a maximum thickness at a position near the first principal surface in the first direction,
    the sintered metal layer includes a first region covered by the conductive resin layer and a second region that (1) is not covered by the conductive resin layer and (2) directly opposes the corresponding end surface, and
    the first region and the second region contact the corresponding end surface.

2. The electronic component according to claim 1, wherein
the thickest portion is located nearer the first principal surface than the second principal surface in the first direction.

3. The electronic component according to claim 1, wherein
the thickest portion is located nearer the first principal surface in the first direction than the second principal surface, in the conductive resin layer.

4. The electronic component according to claim 1, wherein
the conductive resin layer covers a ridge portion located between the first principal surface and the corresponding end surface,
a portion of the conductive resin layer covering the ridge portion is located nearer the first principal surface than the thickest portion in the first direction, and has a thickness smaller than the thickness of the thickest portion.

5. The electronic component according to claim 1, wherein
the conductive resin layer covers a region near the first principal surface of the corresponding end surface.

6. The electronic component according to claim 1, wherein
the conductive resin layer covers a region near the corresponding end surface of the first principal surface.

7. The electronic component according to claim 1, wherein
the external electrodes further include a plating layer covering the conductive resin layer and the second region of the sintered metal layer.

8. An electronic component, comprising:
an element body of a rectangular parallelepiped shape including a first principal surface arranged to constitute a mounting surface, a second principal surface opposing the first principal surface in a first direction, a pair of side surfaces opposing each other in a second direction, and a pair of end surfaces opposing each other in a third direction; and
an external electrode disposed at an end portion of the element body in the third direction, wherein
the external electrode includes a sintered metal layer on one of the pair of end surfaces and a conductive resin layer on the sintered metal layer,
a thickness of the conductive resin layer gradually increases from the second principal surface toward the first principal surface in the first direction, and the conductive resin layer includes a thickest portion at a position near the first principal surface in the first direction,
the sintered metal layer includes a first region covered by the conductive resin layer and a second region that (1) is not covered by the conductive resin layer and (2) directly opposes the one of the pair of end surfaces, and
the first region and the second region contact the one of the pair of end surfaces.

9. The electronic component according to claim 1, wherein the conductive resin layer does not cover a ridge portion of the element body located between the second principal surface and the corresponding end surface.

* * * * *